(12) United States Patent
Muramatsu et al.

(10) Patent No.: US 7,183,767 B2
(45) Date of Patent: Feb. 27, 2007

(54) MAGNETIC SENSING ELEMENT, MAGNETIC SENSOR, AND ITS MANUFACTURING METHOD

(75) Inventors: Sayuri Muramatsu, Hirakata (JP); Ken Takahashi, Osaka (JP); Yoshihiro Tosaki, Ibaraki (JP); Akio Murata, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 153 days.

(21) Appl. No.: 10/506,556

(22) PCT Filed: Mar. 24, 2003

(86) PCT No.: PCT/JP03/03546

§ 371 (c)(1),
(2), (4) Date: Sep. 2, 2004

(87) PCT Pub. No.: WO03/081271

PCT Pub. Date: Oct. 2, 2003

(65) Prior Publication Data

US 2005/0179431 A1    Aug. 18, 2005

(30) Foreign Application Priority Data

Mar. 27, 2002    (JP) .............................. 2002-089542

(51) Int. Cl.
  G01R 33/02    (2006.01)
  G01R 33/00    (2006.01)

(52) U.S. Cl. ...................... 324/251; 324/244; 324/260

(58) Field of Classification Search ........ 324/260–262, 324/251, 244
See application file for complete search history.

(56) References Cited

U.S. PATENT DOCUMENTS

| 5,838,154 A | 11/1998 | Morikawa et al. |
| 5,978,186 A * | 11/1999 | Murata et al. ............... 360/123 |
| 2004/0085671 A1 | 5/2004 | Murata et al. |

FOREIGN PATENT DOCUMENTS

| JP | 8-320362 A | 12/1996 |
| JP | 9-113590 A | 5/1997 |
| JP | 10-90382 A | 4/1998 |
| JP | 2001155310 A | 6/2001 |

* cited by examiner

*Primary Examiner*—Bot LeDynh
(74) *Attorney, Agent, or Firm*—Akin Gump Strauss Hauer & Feld, LLP

(57) ABSTRACT

A conductive wire held between a first magnetic core of a soft magnetic film and a second magnetic core, the area of the cross-section, perpendicular to a magnetic path, of which is made partially smaller constitutes a magnetic detection device, and a DC current for generating a DC bias magnetic field and a high-frequency carrier signal are let to flow through the conductive wire. The DC current is selected so that the portion at which the cross-sectional area of the above-mentioned second magnetic core is made smaller has an appropriate DC bias magnetic field intensity. When this magnetic detection device is placed in an external magnetic field, the intensity of the DC bias magnetic field changes depending on the intensity of the external magnetic field; hence, the level of the carrier signal in the conductive wire changes. The change of the level of the carrier signal is output as the change of an electrical signal, whereby the intensity and direction of the magnetic field are detected.

9 Claims, 33 Drawing Sheets (a)

(b)

(a)

(b)

(c)

(a)

(b)

(a)

(b)

(a)

(b)

(a)

(b)

(a)

(b)

(c)

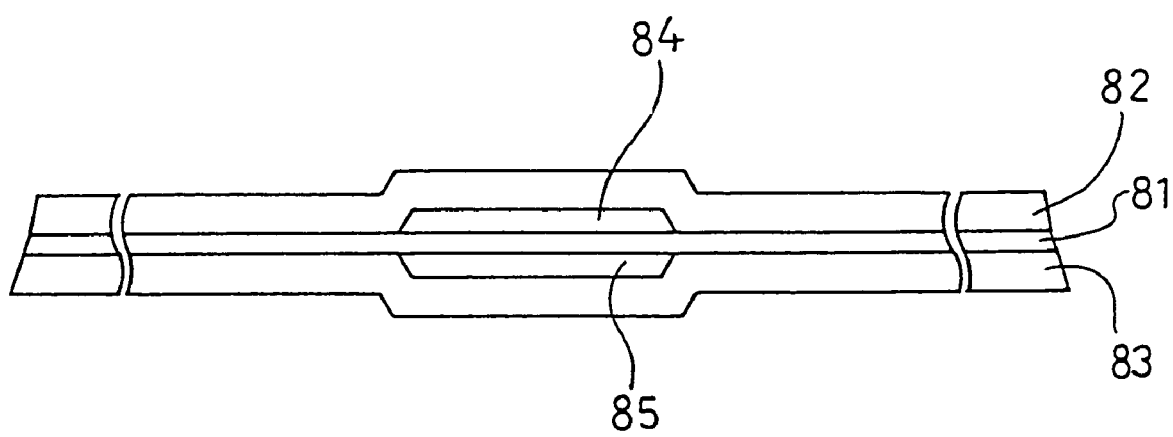
F I G. 20

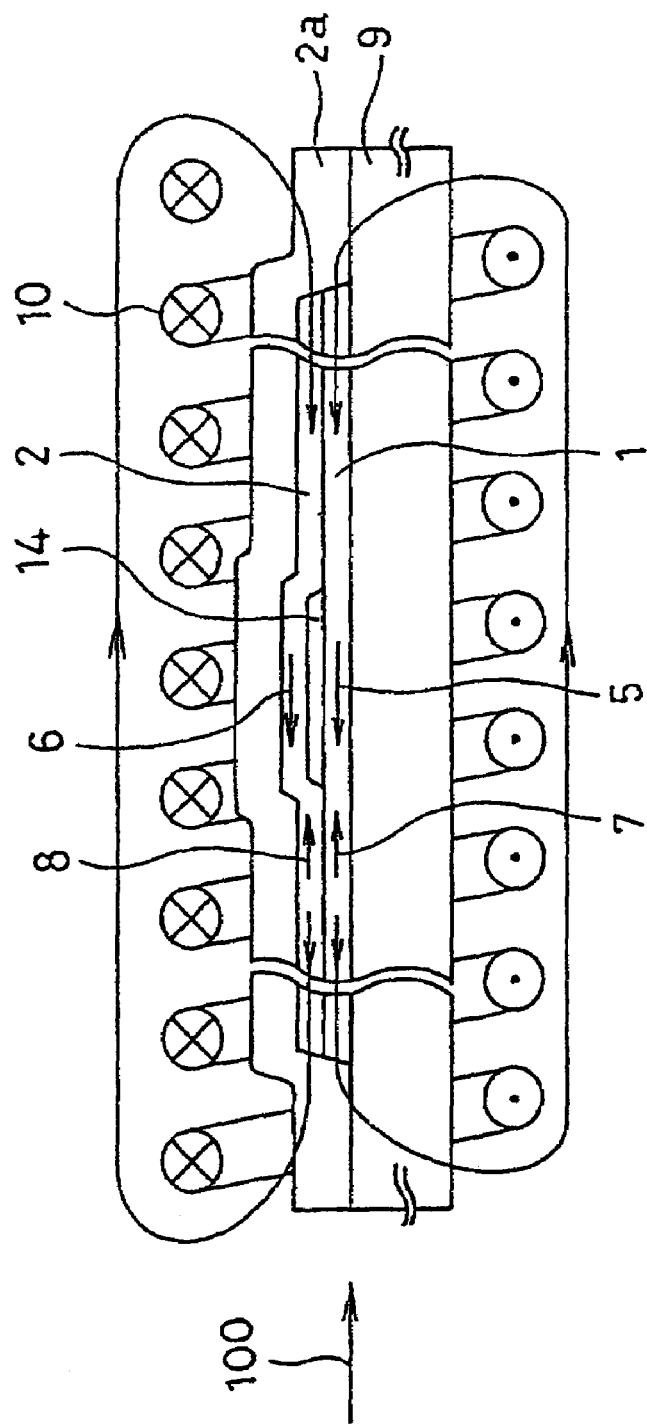
PrioPr Art    FIG. 32

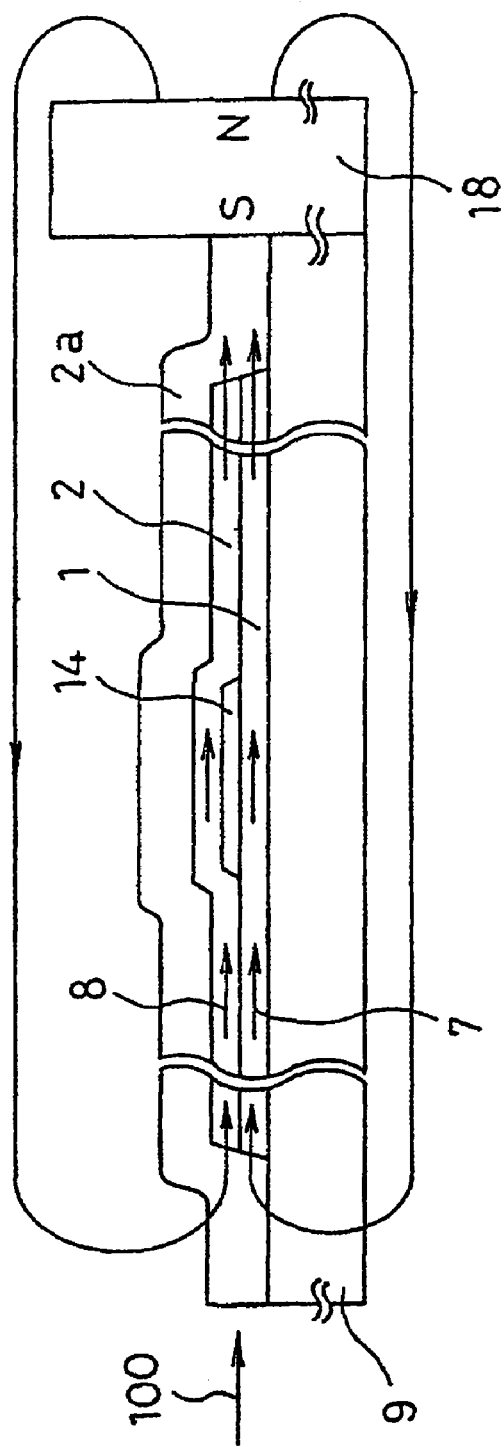
Prior Art FIG. 33

MAGNETIC SENSING ELEMENT, MAGNETIC SENSOR, AND ITS MANUFACTURING METHOD

CROSS-REFERENCE TO RELATED APPLICATION

This application is a Section 371 of International Application No. PCT/JP03/03546, filed Mar. 24, 2003, the disclosure of which is incorporated herein by reference.

TECHNICAL FIELD

The present invention relates to a magnetic detection device utilizing a magnetic impedance effect wherein the impedance of a detection conductor changes depending on magnetism, and to a method for producing the device.

Background Art

A magnetoresistance-effect-type magnetic sensor (hereafter referred to as an MR sensor) has been known conventionally as a magnetic detection device (magnetic sensor) for detecting weak magnetism or magnetic field. The MR sensor detects a magnetic field by using a magnetoresistance effect wherein the resistance value of the detection conductor of the MR sensor varies depending on the intensity of a magnetic field. The change of the resistance of the detection conductor by the magnetoresistance effect in the case of a reversed magnetic field reversed in the direction of the magnetic field is the same as that in the case of the magnetic field in the original direction, therefore the polarity (N or S) of the magnetic field cannot be detected. In order to detect the polarity of the magnetic field by an MR sensor, a bias magnetic field is applied to the MR sensor so that the change of the resistance depending on the magnetic field becomes different depending on the polarity of the magnetic field. In order to apply the bias magnetic field, there is a method that a conductor is provided in the vicinities of the magnetic poles of the MR sensor and a DC bias current is made flow through the conductor, and another method that permanent magnets are disposed at both ends of the magnetic poles. Since the MR sensor detects a magnetic field by using the change of the DC resistance of the conductor depending on an external magnetic field, the change of the DC resistance is significantly affected by the magnetic material of the magnetic poles; however, its magnetic field detection sensitivity is not so high, about 0.1% to 3%/Oe.

As a magnetic sensor having detection sensitivity higher than that of the MR sensor, a magnetic sensor utilizing a "magnetic impedance effect" is available. In this kind of magnetic sensor, the permeability of the soft magnetic material thereof changes depending on the intensity of a magnetic field (magnetic flux density), and the inductance of the conductor inside a magnetic circuit changes depending on the change of the permeability; as a result, the magnetic field is detected on the basis of the magnetic impedance effect, that is, a phenomenon wherein the impedance changes. The sensitivity of a typical magnetic sensor of this kind is 6%/Oe or more.

A conventional example of a magnetic sensor utilizing the magnetic impedance effect will be described below.

A magnetic sensor in accordance with a first conventional example will be described referring to FIGS. 30 and 31. FIG. 31 is a circuit diagram of a magnetic detection apparatus, and FIG. 30 is a cross-sectional view of the magnetic sensor in accordance with the first conventional example that is incorporated in the magnetic detection apparatus. In all the figures including FIG. 30, cross-sections are not hatched for better visibility. In FIG. 30, two magnetic materials 1 and 2 are joined together to form magnetic poles, and a conductive wire 14 is held between the magnetic materials 1 and 2. The conductive wire 14 shown in FIG. 30 is connected to a DC power source 132 shown in FIG. 31; when a DC current is flown from rear to front in a direction perpendicular to the face of the paper as indicated by a round mark 4 having a black point in the center, magnetic fluxes indicated by arrows 5 and 6 are generated in the magnetic materials 1 and 2, and a DC bias magnetic field is obtained. In this state, when the magnetic sensor is placed in an external magnetic field (hereafter referred to as an external magnetic field 100), the direction of which is indicated by arrow 100, magnetic fluxes indicated by arrows 7 and 8, respectively, (hereafter referred to as magnetic fluxes 7 and 8, respectively) pass through the magnetic materials 1 and 2. Since the direction of the magnetic flux 7 passing through the magnetic material 1 is the same as that of the magnetic flux 5 of the DC bias magnetic field, the density of the magnetic flux passing below the conductive wire 14 increases. On the other hand, since the direction of the magnetic flux 8 passing through the magnetic material 2 is opposite to that of the magnetic flux 6 of the DC bias magnetic field, the density of the magnetic flux passing above the conductive wire 14 decreases. As a result, in the vicinity of the conductive wire 14, the permeability of the magnetic material 1 lowers, and the permeability of the magnetic material 2 rises. The changes of the permeabilities of the magnetic materials 1 and 2 are respectively reversed when the direction of the external magnetic field 100 is reversed.

Theoretically, the magnetic sensor in accordance with the first conventional example cannot detect the direction of the external magnetic field 100. However, in experiments, the direction of the external magnetic field 100 can be detected, although detection sensitivity is low. It is presumed that the reason is as follows. That is to say, the permeabilities of the magnetic materials 1 and 2 in the vicinity of the conductive wire 14 change depending on the direction of the external magnetic field 100. The inductance of the conductive wire 14 changes depending on the changes of the permeabilities. When the high-frequency oscillator 131 shown in FIG. 31 is connected to the conductive wire 14 and a high-frequency current is flown therethrough, the inductance of the conductive wire 14 changes depending on the change of the above-mentioned inductance. The voltage across both terminals 134 and 137 of the conductive wire 14 changes depending on the change of the impedance, whereby the intensity and direction of the external magnetic field can be detected by this voltage change.

FIG. 32 is a cross-sectional view of a magnetic sensor in accordance with a second conventional example. In the figure, magnetic materials 1 and 2 and a conductive wire 14, similar to those of the first conventional example shown in the above-mentioned FIG. 30, are provided on a substrate 9 made of a nonmagnetic material. A protective film 2a is provided to protect the magnetic material 2. The magnetic sensor having this configuration is inserted into a coil 10 in which a DC current flows, whereby a DC bias magnetic field is applied.

FIG. 33 is a cross-sectional view of a magnetic sensor in accordance with a third conventional example. In the figure, the configuration of the magnetic sensor having a substrate 9, magnetic materials 1 and 2, a conductive wire 14 and a protective film 2a is the same as that shown in FIG. 32. In the third conventional example, a DC bias magnetic field is applied by a permanent magnet 18.

In the magnetic sensors shown in FIGS. 32 and 33, the magnetic fluxes of the DC bias magnetic field pass through the magnetic materials 1 and 2 in the same direction. When the magnetic sensor shown in FIG. 32 is placed in an external magnetic field 100, the directions of the magnetic fluxes 5 and 6, caused by the DC bias magnetic field, in the magnetic materials 1 and 2 are opposite to the directions of the magnetic fluxes 7 and 8 caused by the external magnetic field 100, whereby the densities of the magnetic fluxes 5 and 6 decrease. As a result, the permeabilities of the magnetic materials 1 and 2 increase, and the impedance of the conductive wire 14 also increases. Inversely, when this magnetic sensor is placed in an external magnetic field 100 having a direction opposite to that indicated by the arrow, the directions of the magnetic fluxes caused by the external magnetic field become opposite to the directions indicated by arrows 7 and 8, whereby the directions become the same as those of the magnetic fluxes 5 and 6 caused by the DC bias. As a result, the densities of the magnetic fluxes 5 and 6 increase, the permeabilities of the magnetic materials 1 and 2 decrease, and the impedance of the conductive wire 14 also decreases. The intensity and the direction of the external magnetic field 100 can be distinguished in a way similar to that of the first conventional example on the basis of the increase/decrease of the densities of the magnetic fluxes 5 and 6 depending on the direction of the external magnetic field 100. The principle of distinguishing the direction of the external magnetic field 100 in the magnetic sensor shown in FIG. 33 is the same as that shown in FIG. 32.

In the magnetic sensor in accordance with the first conventional example shown in FIG. 30, the change of the magnetic density is relatively small between the case wherein the direction of the external magnetic field 100 is the direction indicated by the arrow and the case wherein the direction is opposite thereto, whereby the change of the impedance of the conductive wire 14 is also small. Therefore, the detection sensitivity of the direction of the external magnetic field 100 is low, and the detection sensitivity of the intensity of the external magnetic field is also low.

In the magnetic sensor in accordance with the second conventional example shown in FIG. 32, the coil 10 for generating the DC bias magnetic field is large and its power consumption is large, although its detection sensitivity is high. For this reason, a magnetic sensor being compact in size and low in power consumption cannot be attained.

In the magnetic sensor in accordance with the third conventional example shown in FIG. 33, since the permanent magnet is used, the adjustment of the intensity of the bias magnetic field is not easy. In addition, since the permanent magnet is installed, the weight increases, and an installation space for the permanent magnet is required, whereby the magnetic sensor can be made compact in size and light in weight.

DISCLOSURE OF THE INVENTION

The present invention is intended to provide a magnetic detection device being compact in size and low in weight and capable of detecting the intensity and direction of an external magnetic field at high sensitivity.

A magnetic detection device in accordance with the present invention comprises a first magnetic core made of a soft magnetic film, a conductive wire formed on the above-mentioned first magnetic core at a portion thereof, and a second magnetic core made of a soft magnetic film and formed on the above-mentioned first magnetic core and the above-mentioned conductive wire so that the above-mentioned conductive wire is held therebetween, the area of the cross-section, perpendicular to a magnetic path, of which is partially different.

In the magnetic detection device in accordance with the present invention, a DC current for magnetic bias and a high-frequency carrier signal are made flow through the conductive wire, whereby a magnetic detector is configured. In this magnetic detector, the above-mentioned DC current is set so that the magnetic field intensity at a portion wherein the cross-sectional area of above-mentioned second magnetic core is different becomes an "appropriate DC bias magnetic field intensity." The appropriate DC bias magnetic field intensity is defined as a magnetic field intensity wherein in a characteristic curve representing the relationship between the magnetic field intensities caused by the bias magnetic fluxes passing through the first and second magnetic cores of the magnetic detection device and the permeabilities thereof, the change of the permeability with respect to the change of the magnetic field intensity becomes the largest. By setting the magnetic field intensity at the portion wherein the cross-sectional area of the second magnetic core is different at the above-mentioned appropriate DC bias magnetic field intensity, the amount of the change of the permeability with respect to the amount of the change of the magnetic field intensity depending on an external magnetic field at the portion wherein the above-mentioned area is different becomes larger. Hence, a magnetic detector having high magnetic field intensity detection sensitivity is obtained. Since the direction of the change of the permeability (increase or decrease) is determined depending on the direction of the external magnetic field, the direction of the external magnetic field can be detected depending on the direction of the change of the permeability.

A magnetic detection device in accordance with another aspect of the present invention comprises a first magnetic core made of a soft magnetic film, the area of the cross-section, perpendicular to a magnetic path, of which is partially different, a conductive wire formed on the above-mentioned first magnetic core at a portion thereof, and a second magnetic core made of a soft magnetic film and formed on the above-mentioned first magnetic core and the above-mentioned conductive wire so that the above-mentioned conductive wire is held therebetween, the area of the cross-section, perpendicular to a magnetic path, of which is partially smaller in the vicinities of the fringe portions of the above-mentioned conductive wire than that of the other portion.

With the present invention, the DC current for magnetic bias is set so that the magnetic field intensity at the portion wherein the cross-sectional area of the above-mentioned second magnetic core is made smaller becomes the appropriate DC bias magnetic field intensity. When this magnetic detection device is placed in an external magnetic field, the permeability is changed by the change of the magnetic field intensity of the magnetic core depending on the external magnetic field, whereby the intensity and direction of the external magnetic field can be detected.

A magnetic detection device in accordance with another aspect of the present invention comprises a first magnetic core made of a soft magnetic film, a conductive wire formed on the above-mentioned first magnetic core at a portion thereof, and a second magnetic core made of a soft magnetic film and formed on the above-mentioned first magnetic core so that the above-mentioned conductive wire is held therebetween, the thickness of which is smaller than that of the above-mentioned first magnetic core.

With the present invention, since one of the two magnetic cores is made thinner than the other, the DC bias magnetic flux density of the thinner magnetic core rises. By setting the DC bias magnetic field intensity of the thinner magnetic core at the appropriate DC bias magnetic field intensity, external magnetic field detection sensitivity can be raised.

A magnetic detection device in accordance with another aspect of the present invention comprises a first magnetic core made of a soft magnetic film, a conductive wire formed on the above-mentioned first magnetic core at a portion thereof, and a second magnetic core made of a soft magnetic film and formed on the above-mentioned first magnetic core so that the above-mentioned conductive wire is held therebetween, the thickness of which is larger than that of the above-mentioned first soft magnetic core.

With the present invention, since one of the two magnetic cores is made thinner than the other, the DC bias magnetic flux density of the thinner magnetic core rises. By setting the DC bias magnetic field intensity of the thinner magnetic core at the appropriate DC bias magnetic field intensity, external magnetic field detection sensitivity can be raised.

A magnetic detection device in accordance with another aspect of the present invention comprises a first conductive wire formed in a predetermined region on one face of a first magnetic core made of a soft magnetic film, a second conductive wire formed in a region, opposed to the above-mentioned first conductive wire, on the other face of the above-mentioned first magnetic core, a second magnetic core formed on the above-mentioned one face of the above-mentioned first magnetic core and on the above-mentioned first conductive wire, and a third magnetic core formed on the other face of the above-mentioned first magnetic core and on the above-mentioned second conductive wire.

With the present invention, the first conductive wire and the first and second magnetic cores constitute one magnetic detection device. In addition, the second conductive wire and the first and third magnetic cores constitute another magnetic detection device. Since the two magnetic detection devices are laminated, a magnetic detection device having a smaller occupied area is obtained.

A magnetic detector in accordance with the present invention comprises a first magnetic core made of a soft magnetic film, the area of the cross-section, perpendicular to a magnetic path, of which is partially different, a conductive wire formed on the above-mentioned first magnetic core at a portion thereof, and a second magnetic core made of a soft magnetic film and formed on the above-mentioned first magnetic core and the above-mentioned conductive wire so that the above-mentioned conductive wire is held therebetween, the area of the cross-section, perpendicular to a magnetic path, of which is partially different. The above-mentioned magnetic detector further comprises magnetic bias means for applying a bias magnetic field having a direction parallel with the direction of a detected magnetic field to the above-mentioned first and second magnetic cores, and an AC carrier signal generator for flowing an AC current to the above-mentioned conductive wire in a direction perpendicular to the above-mentioned detected magnetic field.

With the magnetic detector in accordance with the present invention, the impedance of the above-mentioned conductive wire changes depending on an external magnetic field, and the carrier signal level across both the terminals of the conductive wire changes, whereby the external magnetic field can be detected on the basis of this change.

A magnetic detector in accordance with another aspect of the present invention comprises a first conductive wire formed in a predetermined region on one face of a first magnetic core made of a soft magnetic film, a second conductive wire formed in a region, opposed to the above-mentioned first conductive wire, on the other face of the above-mentioned first magnetic core, a second magnetic core made of a soft magnetic film and formed on the above-mentioned one face of the above-mentioned first magnetic core and on the above-mentioned first conductive wire, and a third magnetic core made of a soft magnetic film and formed on the above-mentioned other face of the above-mentioned first magnetic core and on the above-mentioned second conductive wire. The above-mentioned magnetic detector further comprises magnetic bias means for applying a bias magnetic field having a direction parallel with the direction of a detected magnetic field to the above-mentioned first, second and third magnetic cores, and an AC carrier signal generator for flowing AC currents to the above-mentioned first and second conductive wires in a direction perpendicular to the above-mentioned detected magnetic field.

With the present invention, the first conductive wire and the first and second magnetic cores constitute one magnetic detection device. In addition, the second conductive wire and the first and third magnetic cores constitute another magnetic detection device. Since the two magnetic detection devices are laminated, a magnetic detector having a smaller occupied area is obtained.

A magnetic detection device in accordance with another aspect of the present invention comprises a first magnetic core made of a soft magnetic film, having a nearly rectangular shape and formed on a nonmagnetic substrate, a plurality of first conductive wires formed on the above-mentioned first soft magnetic core at predetermined intervals in a direction perpendicular to the longitudinal direction of the above-mentioned rectangular first soft magnetic core, a second magnetic core formed on the above-mentioned first magnetic core so that the above-mentioned first conductive wires are held therebetween, and a plurality of second conductive wires for connecting the above-mentioned plurality of first conductive wires in series.

With the present invention, the conductive wires of the plurality of magnetic detection devices each comprising the first and second magnetic cores and the first conductive wire formed on the same substrate are all connected in series. Hence, the impedance change of the conductive wires depending on an external magnetic field is proportional to the number of the magnetic detection devices, and external magnetic field detection sensitivity is also proportional to the number of the magnetic detection devices.

A magnetic detection device in accordance with another aspect of the present invention comprises a plurality of first magnetic cores having a nearly rectangular shape and formed in parallel on a nonmagnetic substrate, a plurality of first conductive wires formed on the above-mentioned plurality of first magnetic cores at predetermined intervals in a direction perpendicular to the longitudinal direction of the above-mentioned plurality of first magnetic cores, second magnetic cores each formed on the above-mentioned plurality of first magnetic cores so that the above-mentioned first conductive wires are held therebetween, and second conductive wires for connecting the above-mentioned plurality of first conductive wires in series.

With the present invention, the conductive wires of the plurality of magnetic detection devices each comprising the first and second magnetic cores and the first conductive wire formed on the same substrate are all connected in series. Hence, the impedance change of the conductive wire depending on an external magnetic field is proportional to the number of the magnetic detection devices, and external magnetic field detection sensitivity is also proportional to the number of the magnetic detection devices.

A method of producing a magnetic detection device in accordance with the present invention comprises a step of forming a first magnetic core by forming a soft magnetic film in a desired pattern on a nonmagnetic substrate, a step of forming a conductive wire by forming a conductive film in a desired pattern in a predetermined region of the above-mentioned first magnetic core, a step of forming a second magnetic core by forming a soft magnetic film in a desired pattern on the above-mentioned first magnetic core and the above-mentioned conductive wire, and a step of making the thickness of the above-mentioned second magnetic core smaller at predetermined portions thereof.

With the present invention, the magnetic detection device can be produced by using a thin-film formation technology, whereby the magnetic detection device can be mass-produced at low cost.

A method of producing a magnetic detection device in accordance with another aspect of the present invention comprises a step of forming a first magnetic core by forming a soft magnetic film in a desired pattern on a nonmagnetic substrate, a step of forming a conductive wire by forming a conductive film in a desired pattern in a predetermined region of the above-mentioned first magnetic core, a step of forming a second magnetic core by forming a soft magnetic film in a desired pattern on the above-mentioned first magnetic core and the above-mentioned conductive wire, and a step of making the thickness of the above-mentioned second magnetic core smaller at predetermined portions thereof.

With the present invention, the magnetic detection device can be produced by using a thin-film formation technology, whereby the magnetic detection device can be mass-produced at low cost.

A magnetic detection device in accordance with the present invention comprises a first magnetic core made of a soft magnetic film, a first conductive wire formed on the above-mentioned first magnetic core at a portion thereof, a second magnetic core formed in parallel with the above-mentioned first conductive wire while electrically insulated from the above-mentioned first conductive wire, and a second magnetic core made of a soft magnetic film and formed on the above-mentioned first magnetic core so that the above-mentioned first and second conductive wires are held therebetween, and the area of the cross-section perpendicular to a magnetic path is made partially small.

With the present invention, since the conductive wire in which a DC current for a bias magnetic field flows is electrically insulated from the conductive wire in which a high-frequency current flows, the voltage of a DC power source for magnetic bias and the voltage of the power source terminal of an oscillation circuit can respectively be set at any values.

BRIEF DESCRIPTION OF DRAWINGS

Part (a) of FIG. 1 is a plan view of a magnetic detection device in accordance with a first embodiment of the present invention;

Part (b) of FIG. 1 is a Ib—Ib cross-sectional view of part (a);

Figure 2:
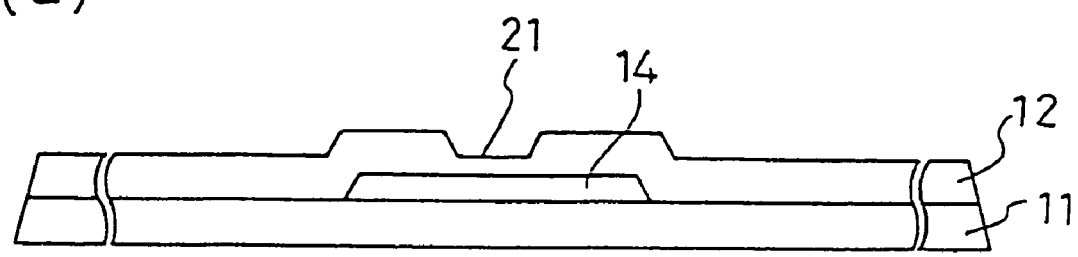
Figure 2:
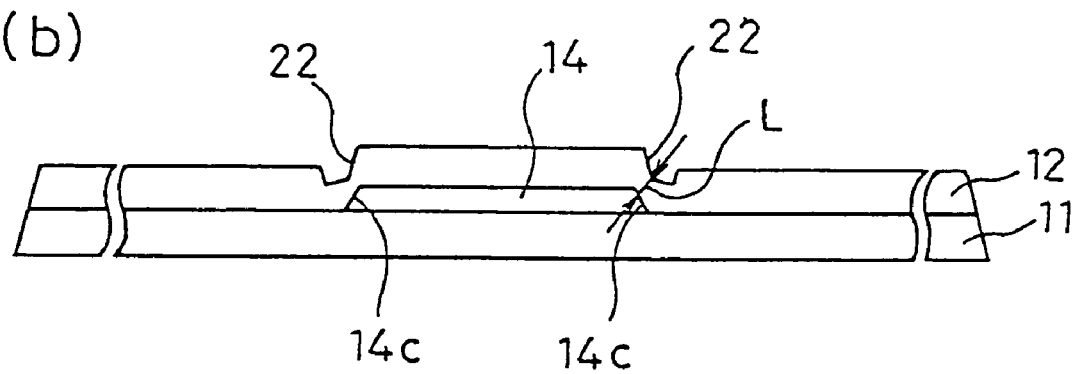
Figure 2:
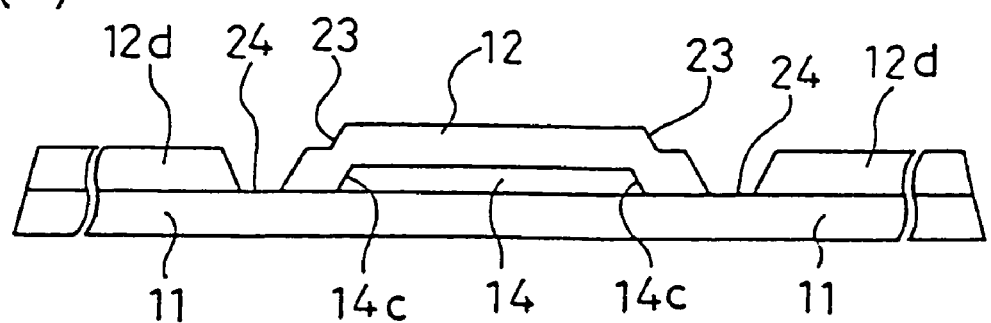
Figure 3:
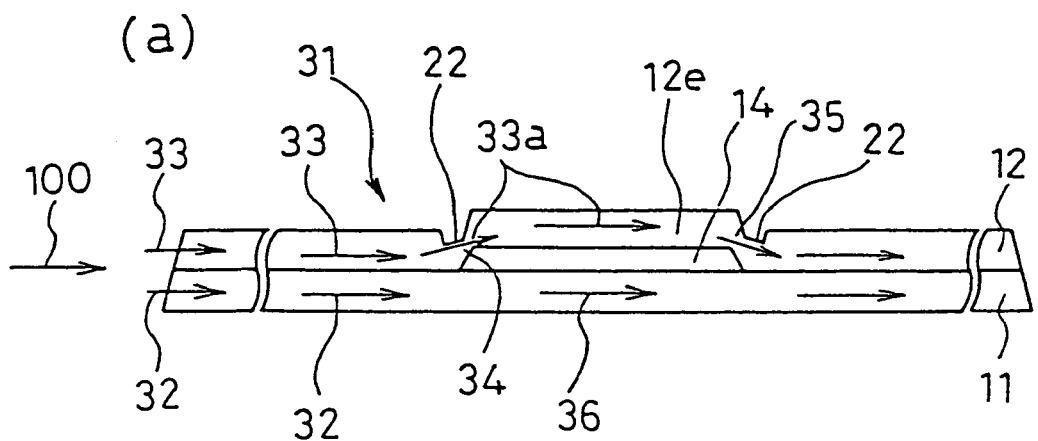
Figure 3:
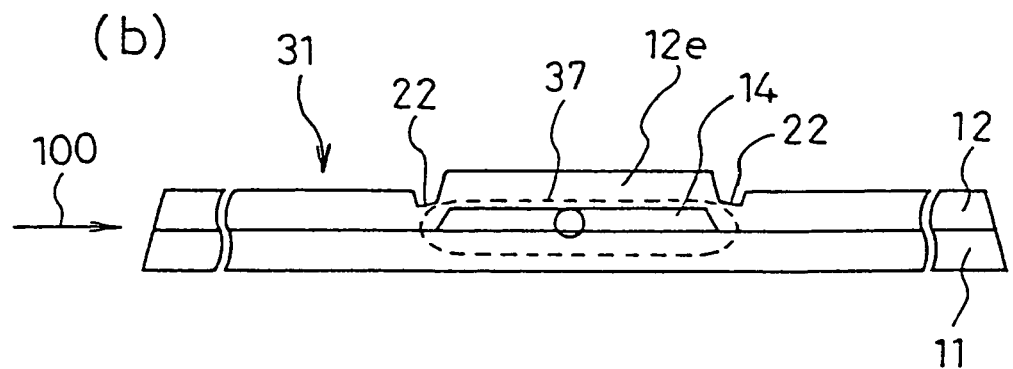
Figure 3:
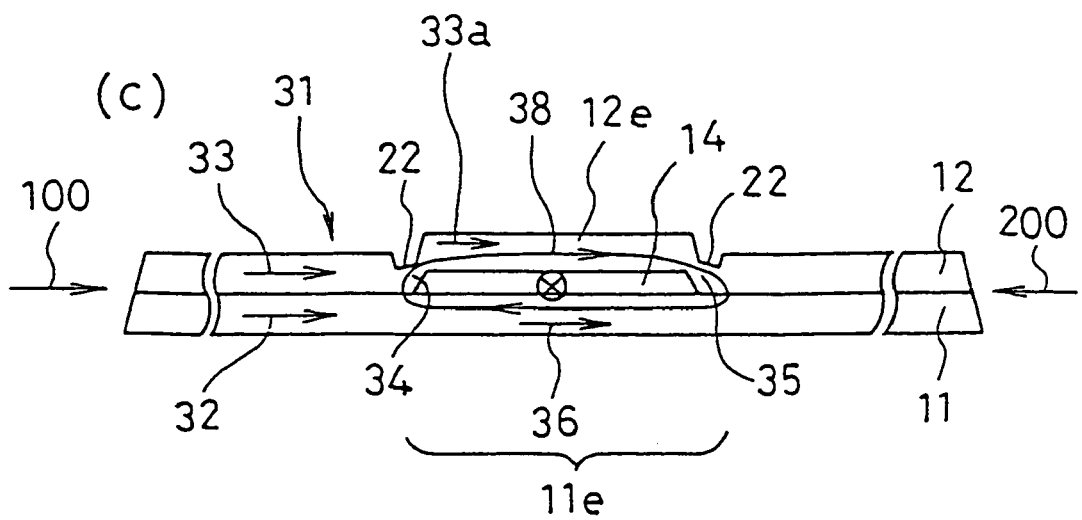
Figure 4:
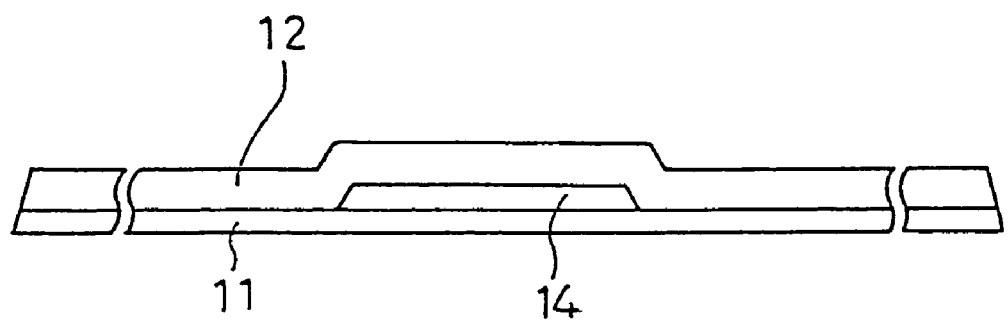
Figure 4:
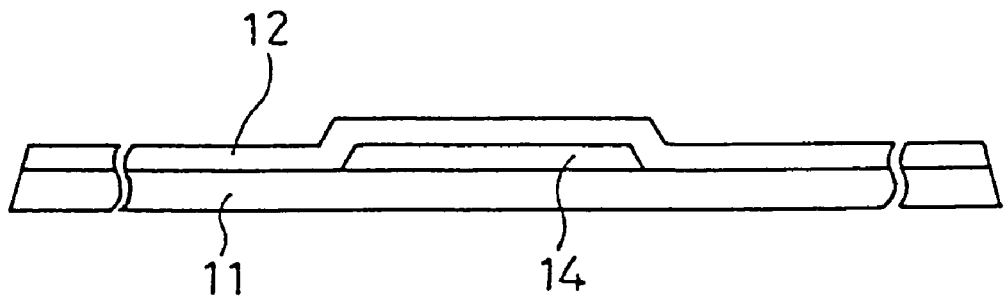
Figure 5:
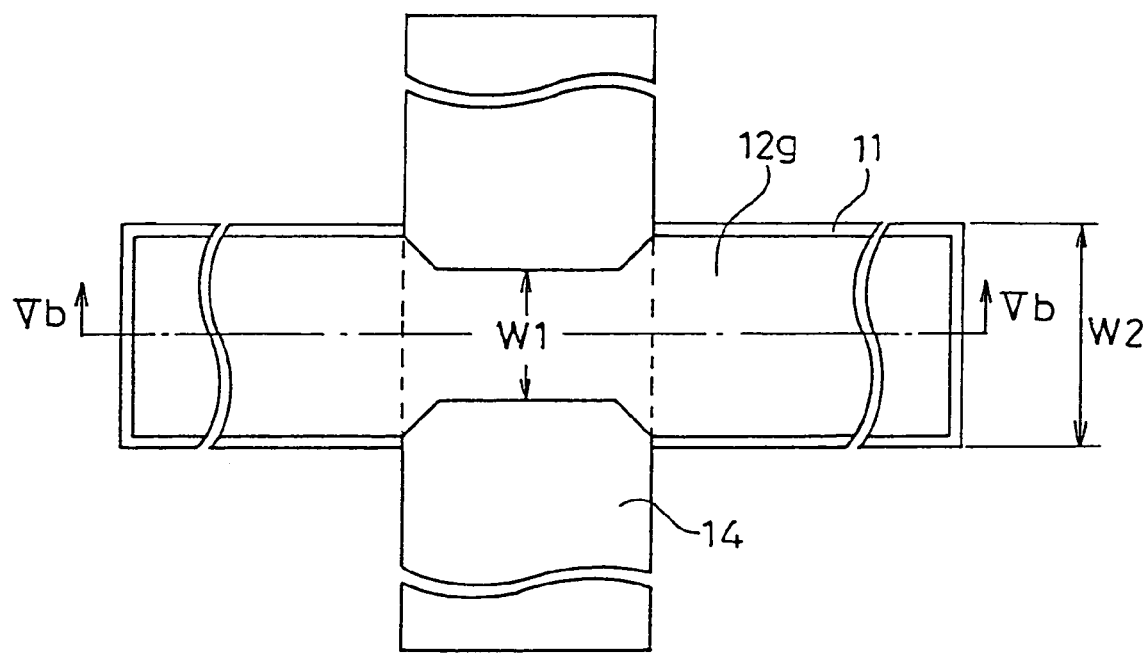
Figure 5:
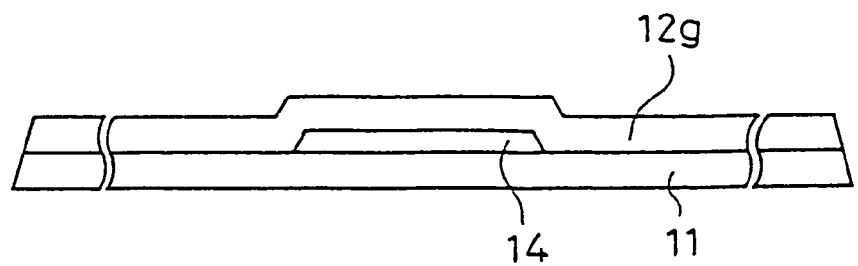
Figure 6:
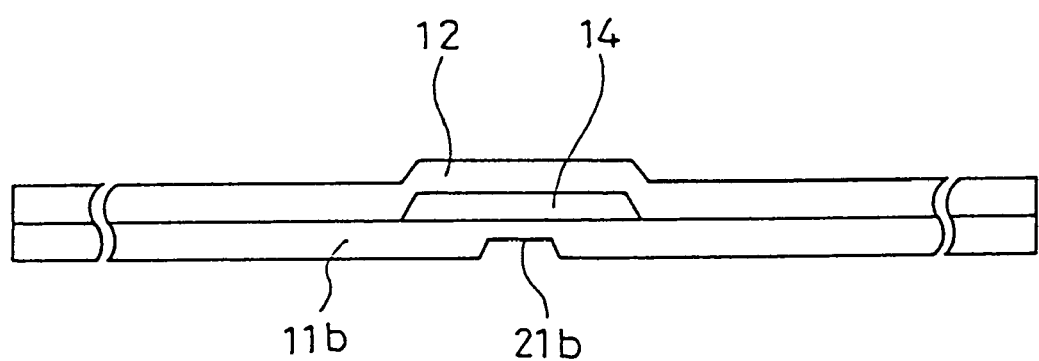
Figure 7:
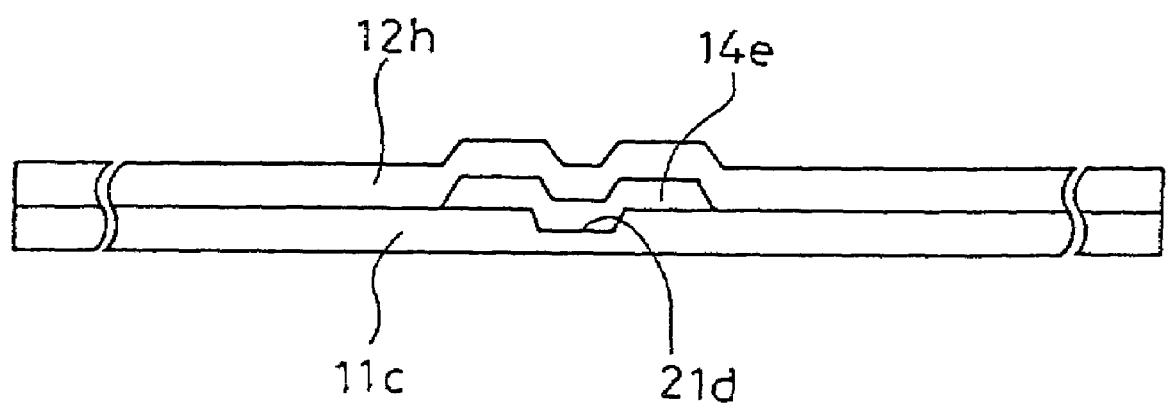
Figure 8:
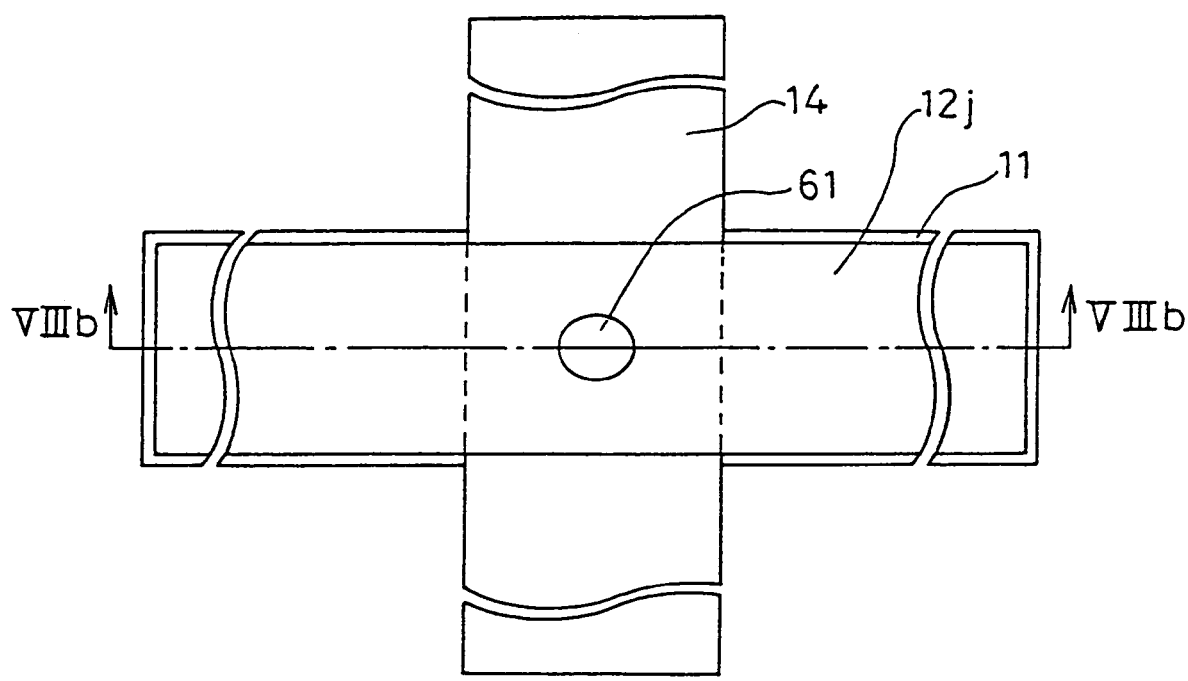
Figure 8:
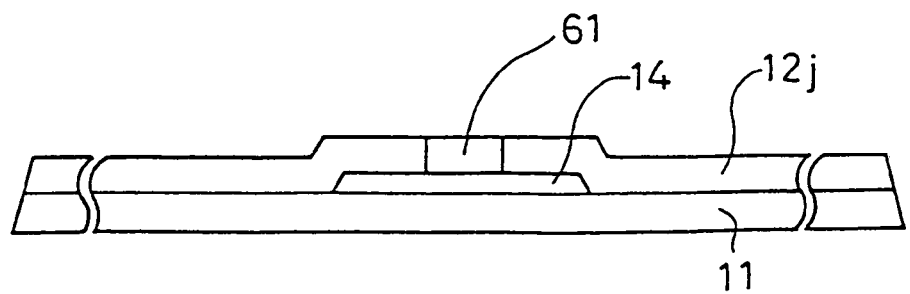
Figure 9:
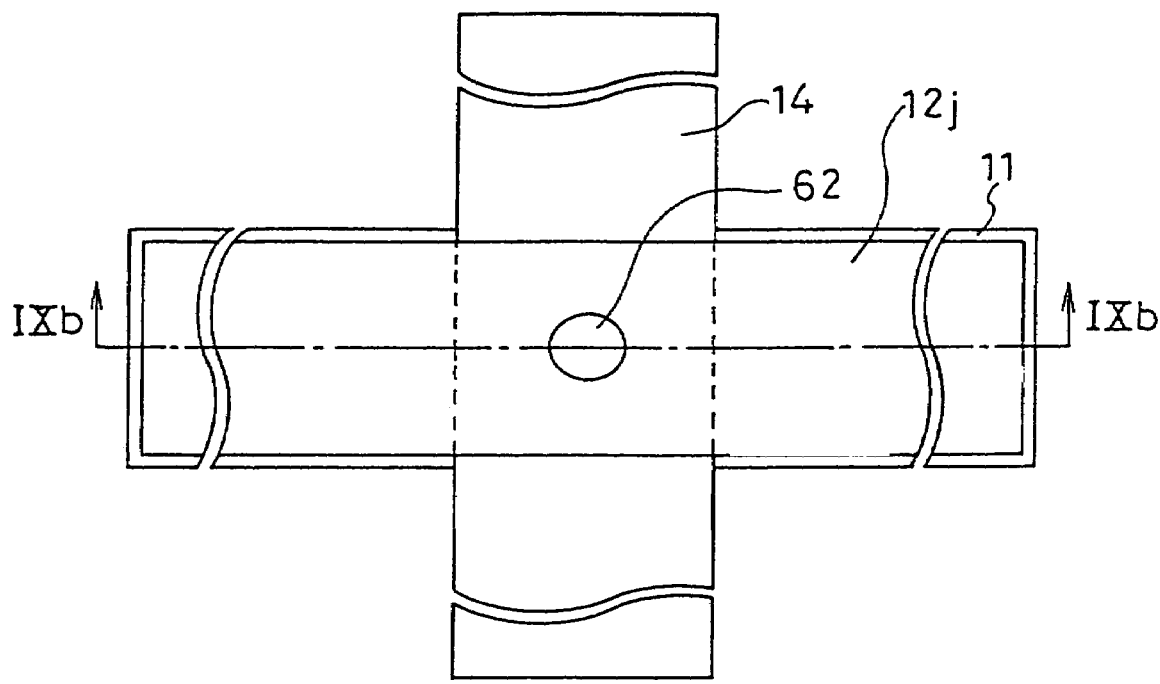
Figure 9:
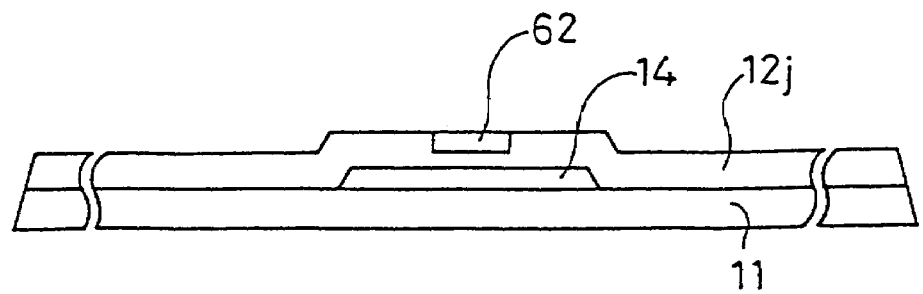
Figure 10:
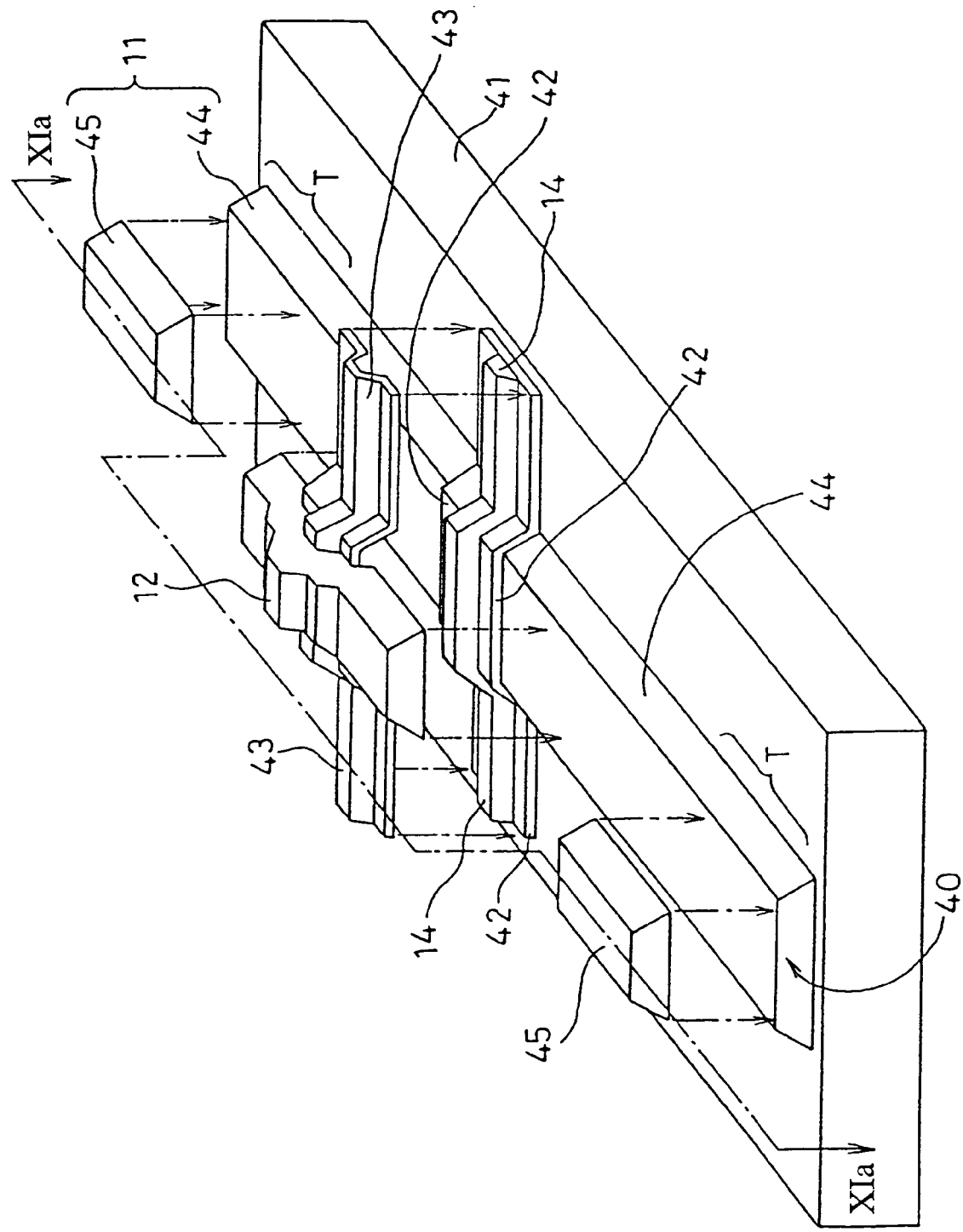
Figure 11:
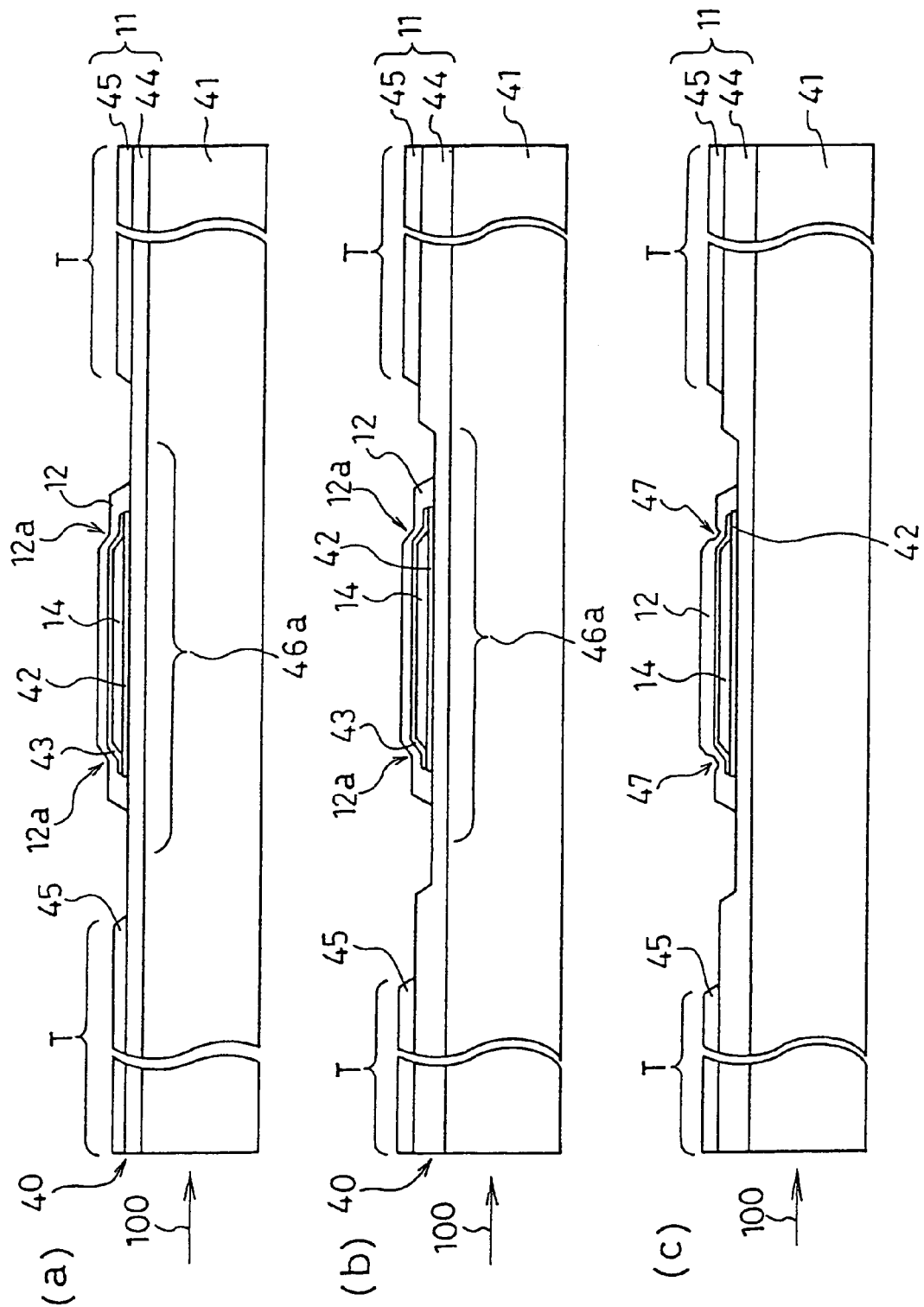
Figure 12:
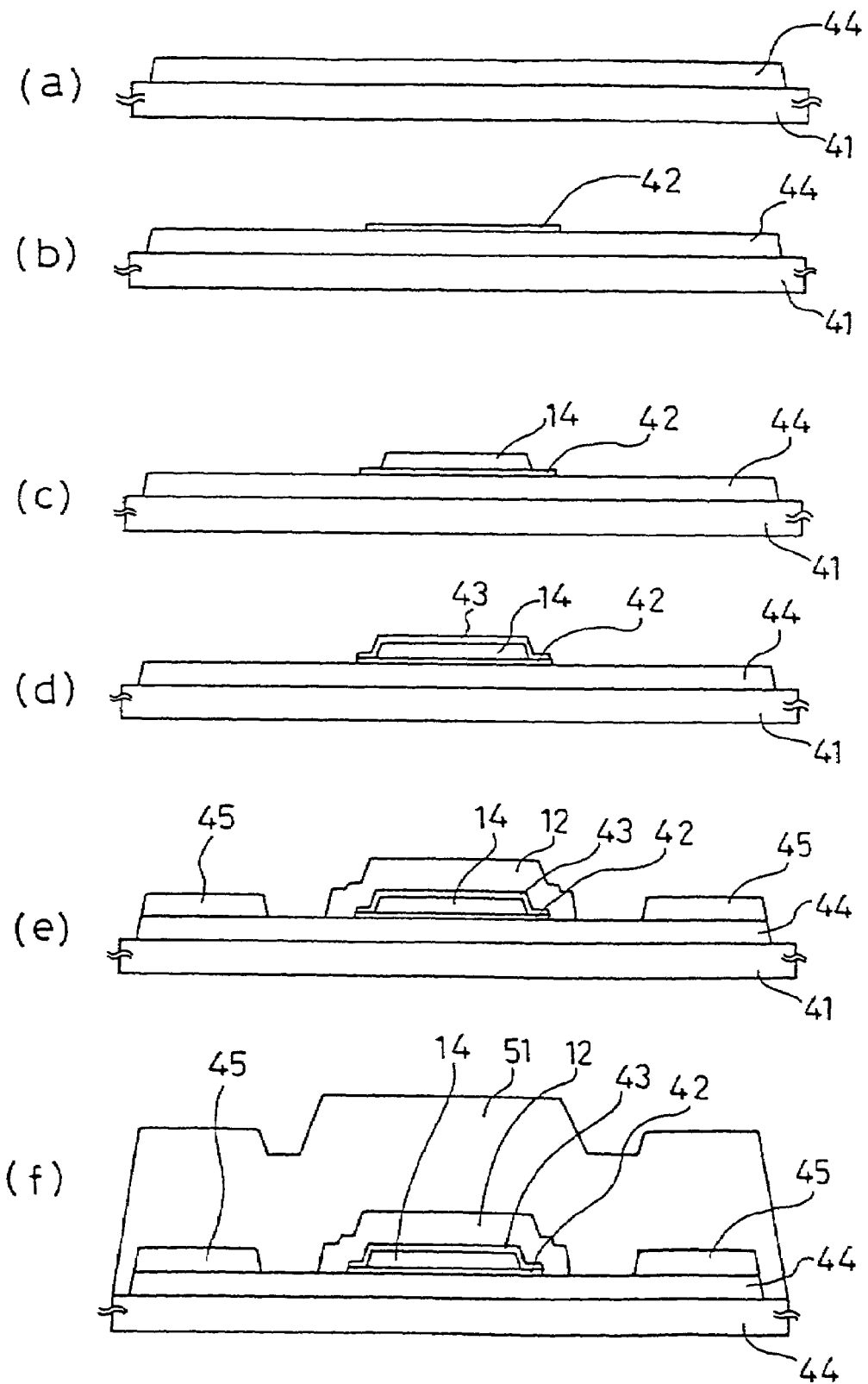
Figure 13:
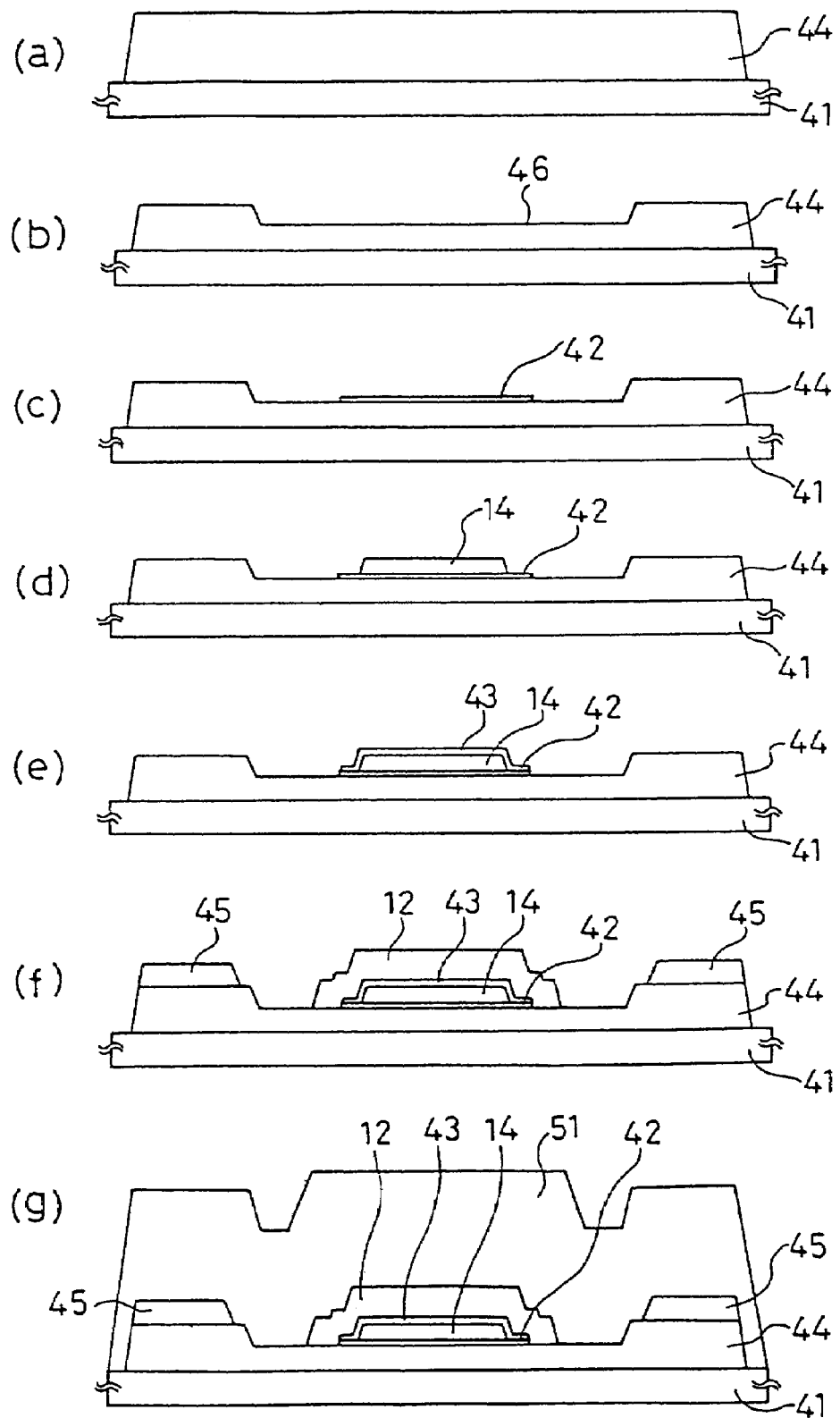
Figure 14:
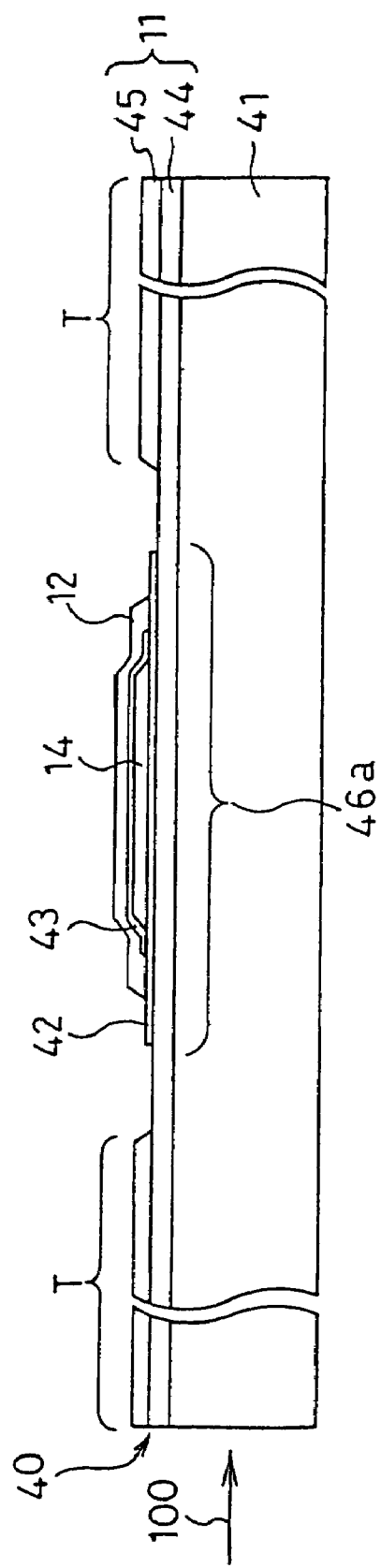
Figure 15:
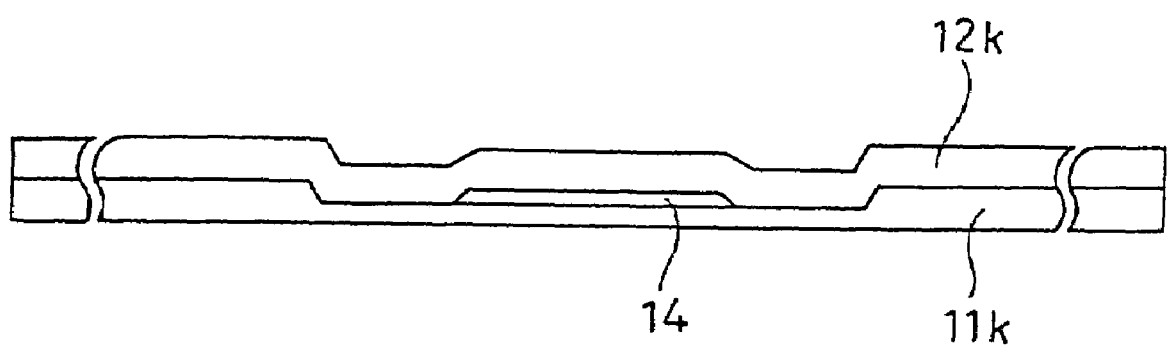
Figure 16:
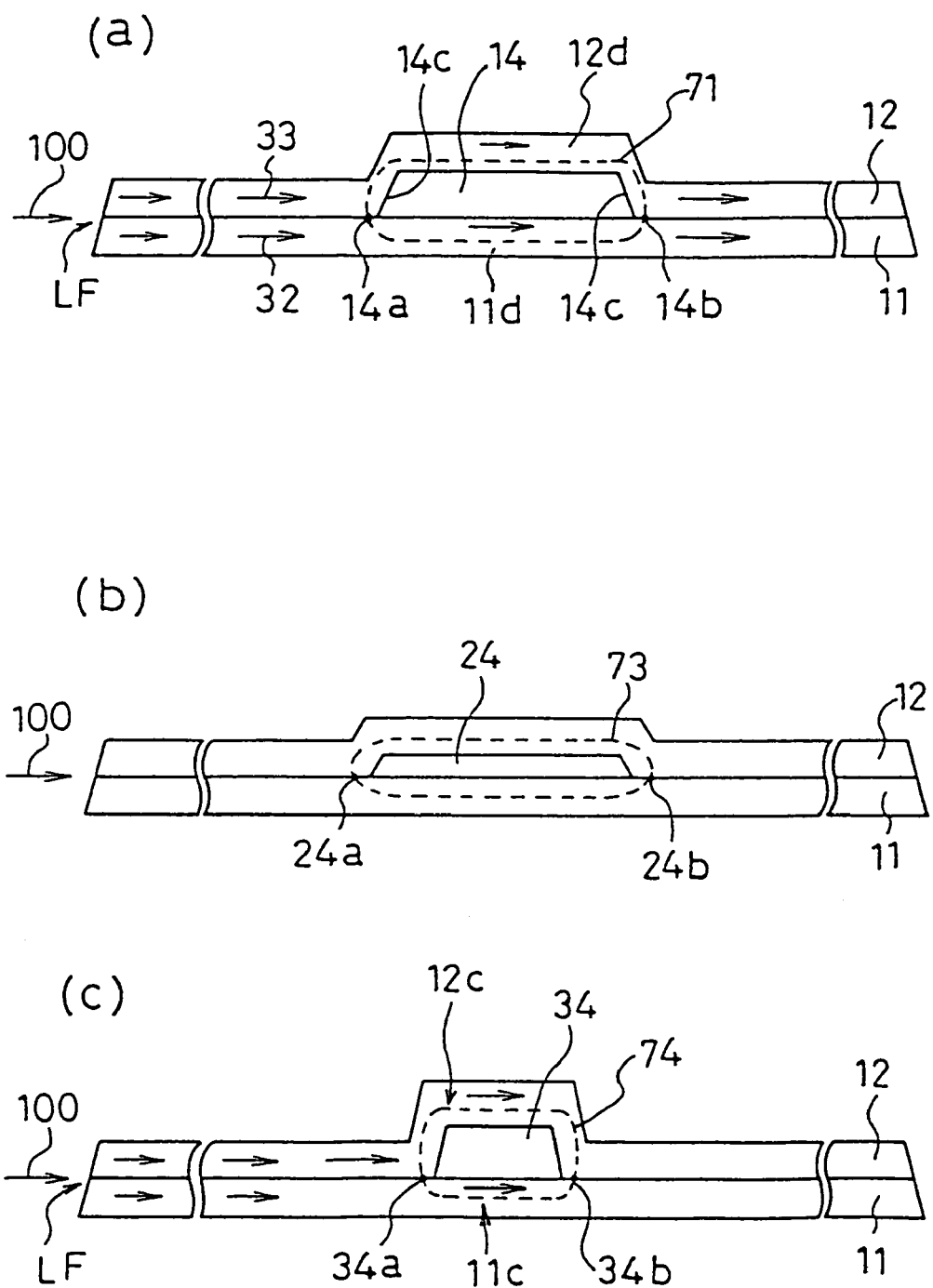
Figure 17:
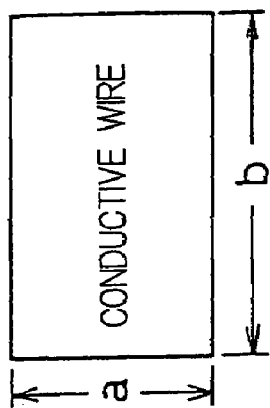
Figure 17:
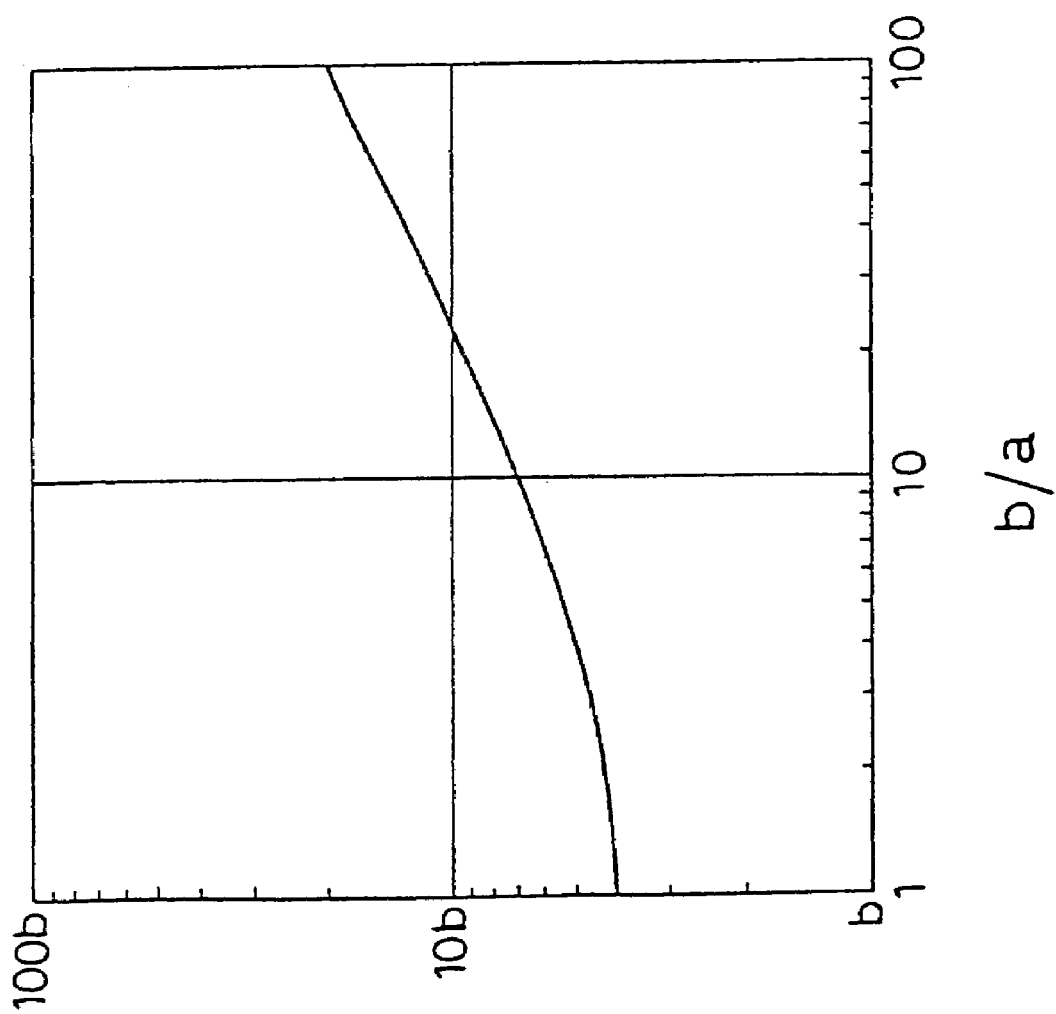
Figure 18:
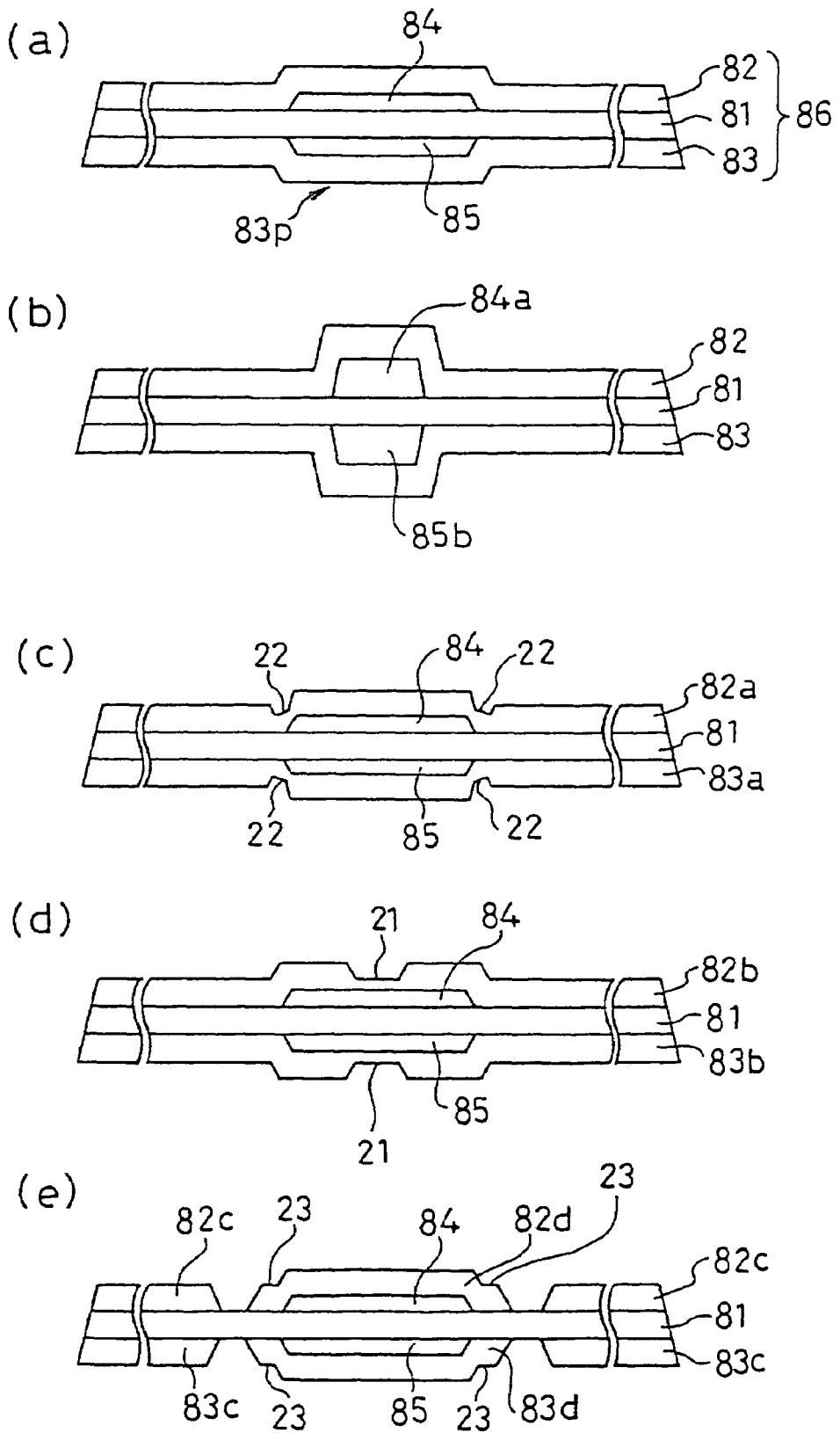
Figure 19:
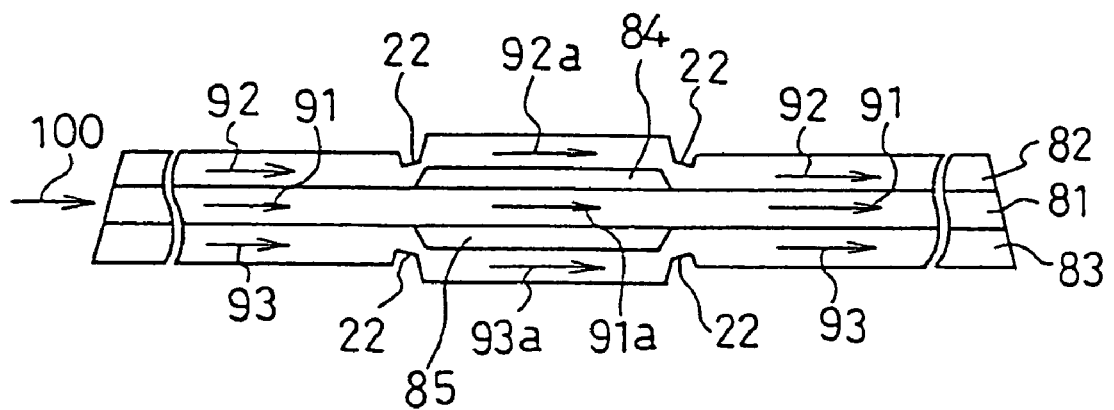
Figure 19:
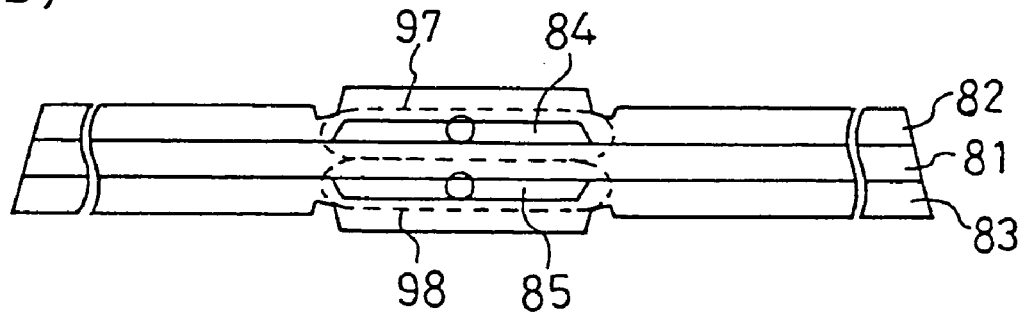
Figure 19:
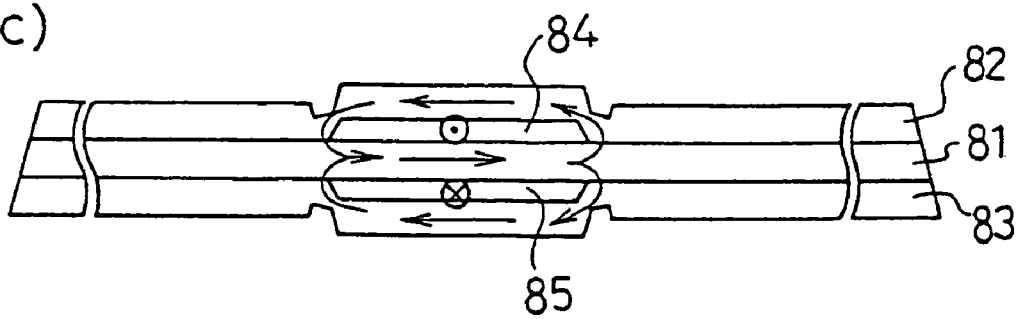
Figure 21:
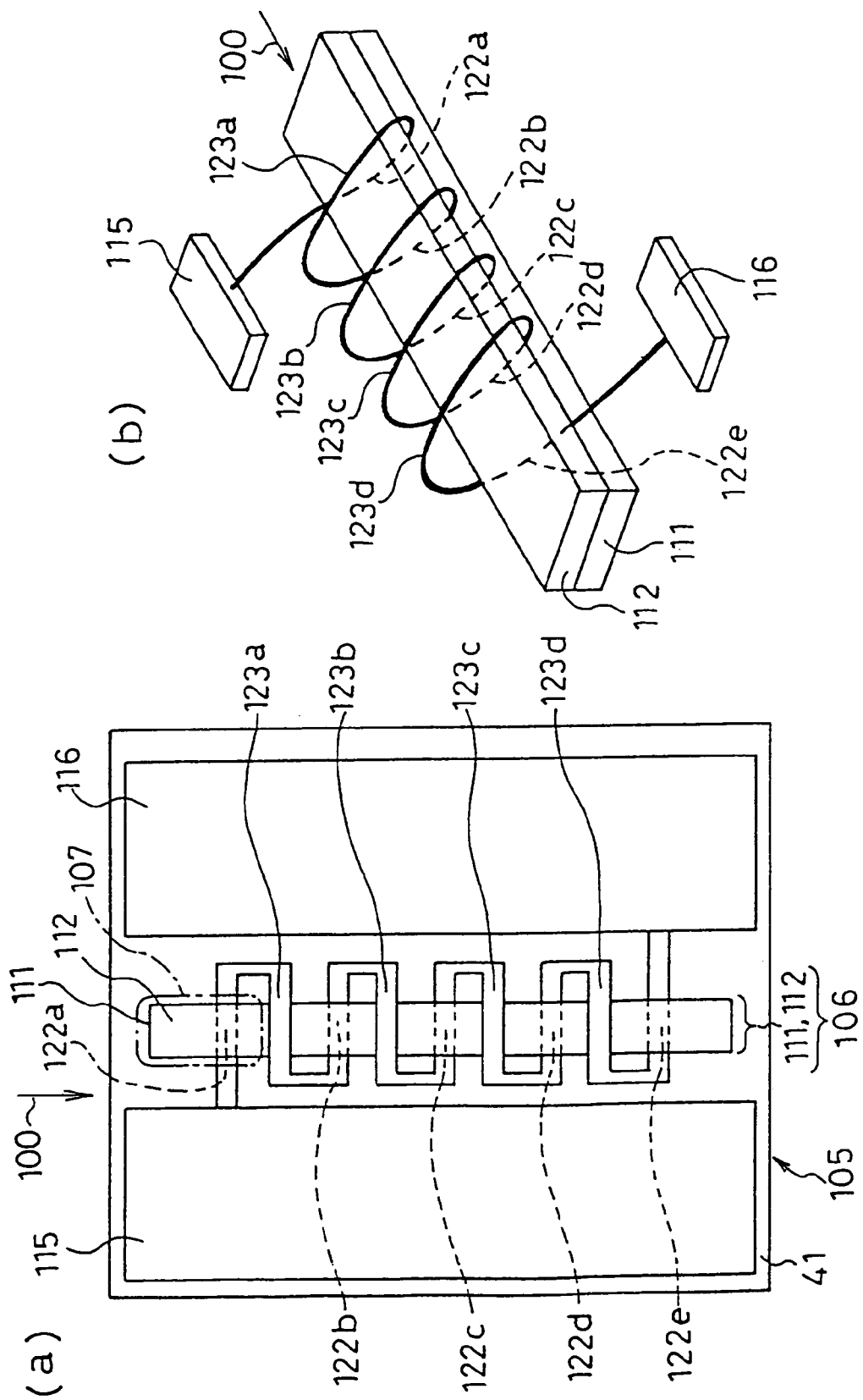
Figure 22:
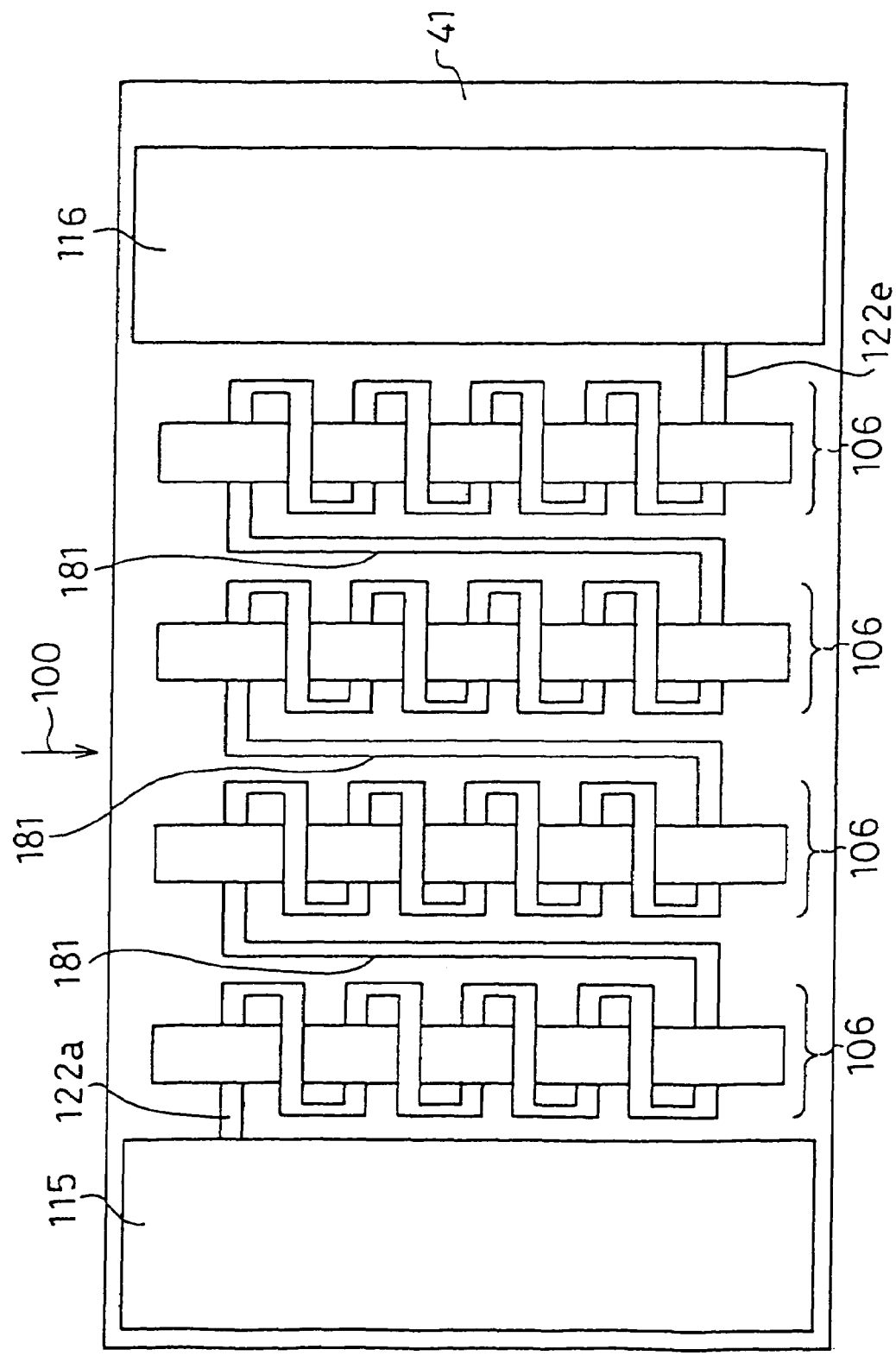
Figure 23:
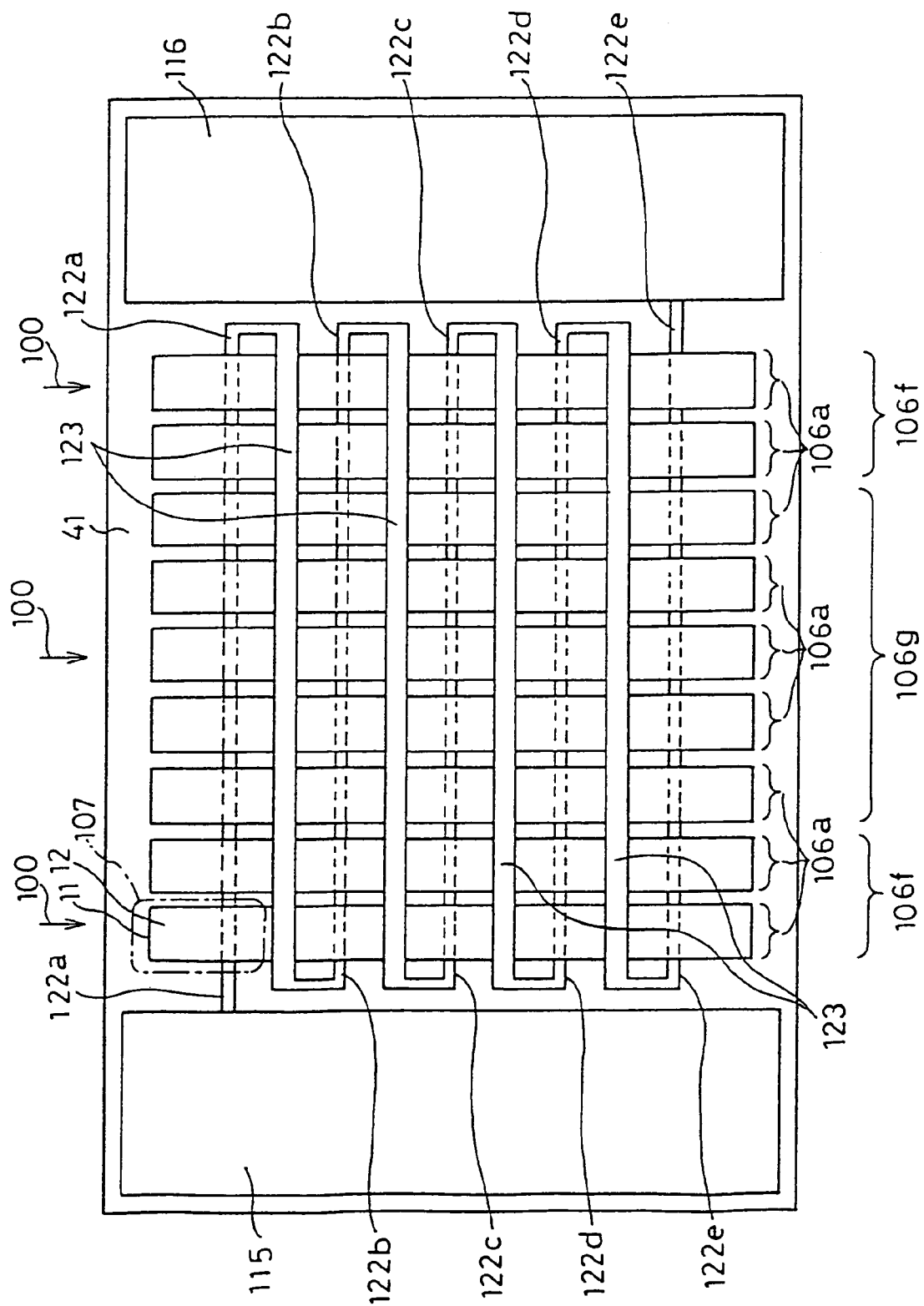
Figure 24:
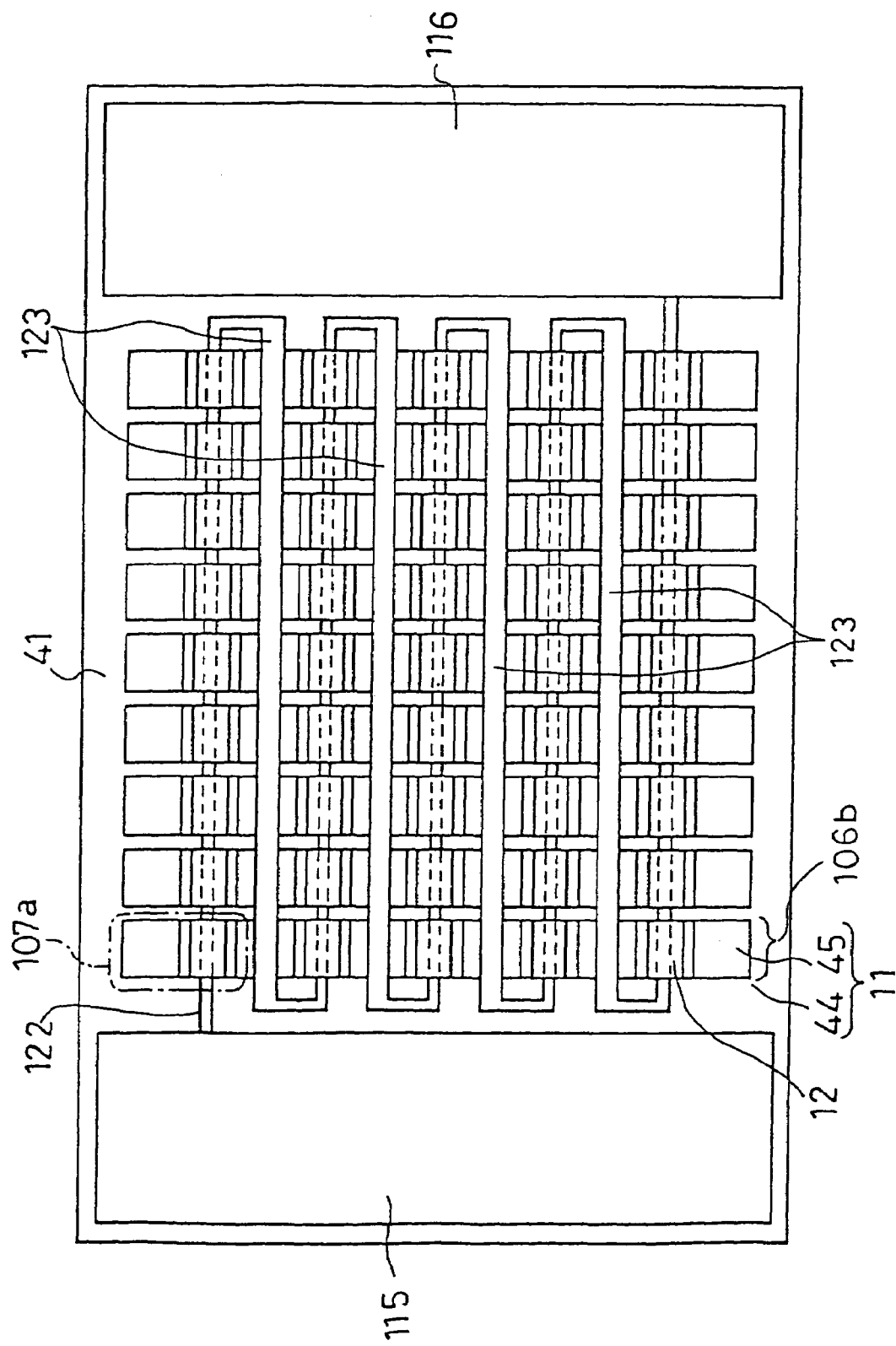
Figure 25:
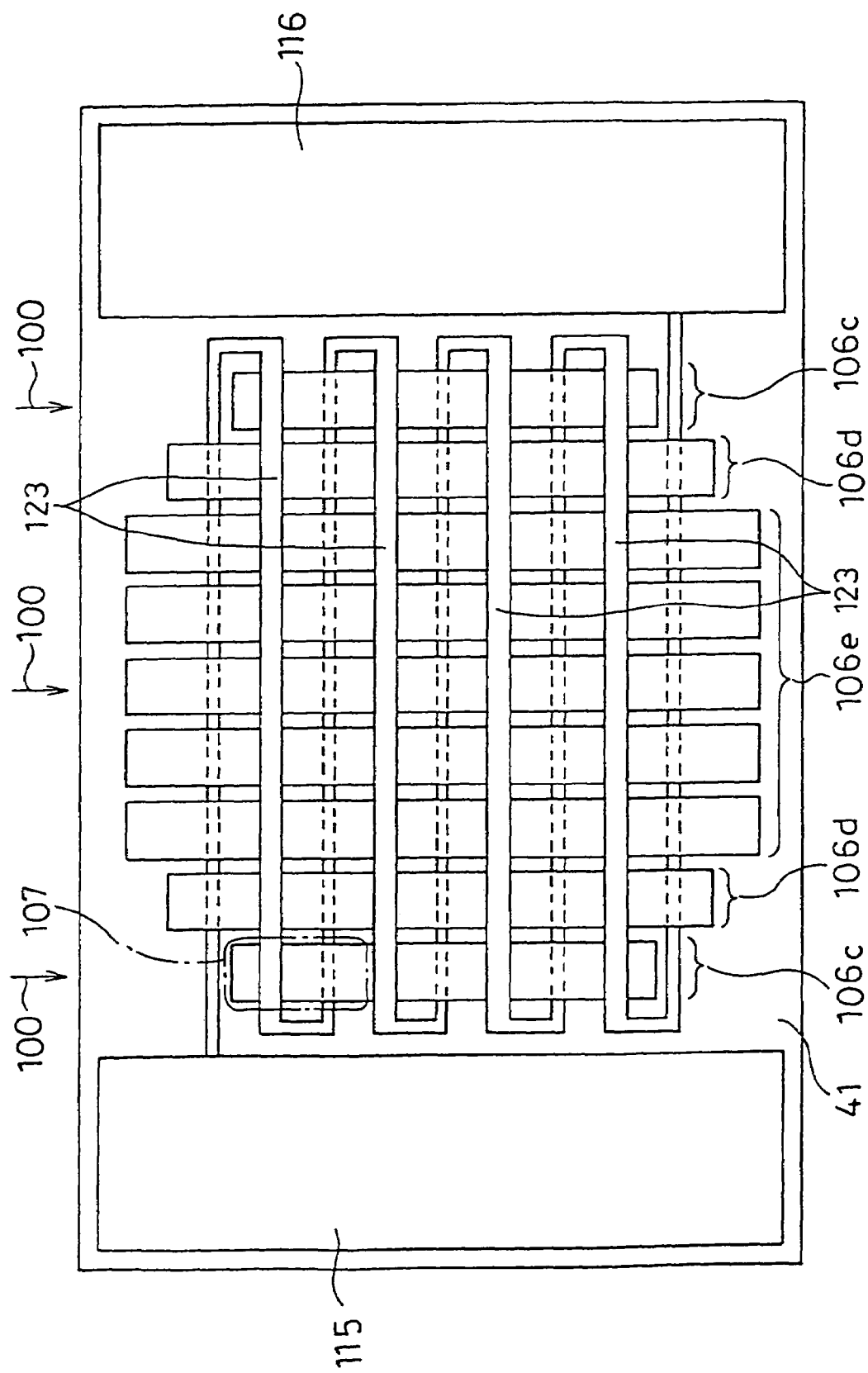
Figure 26:
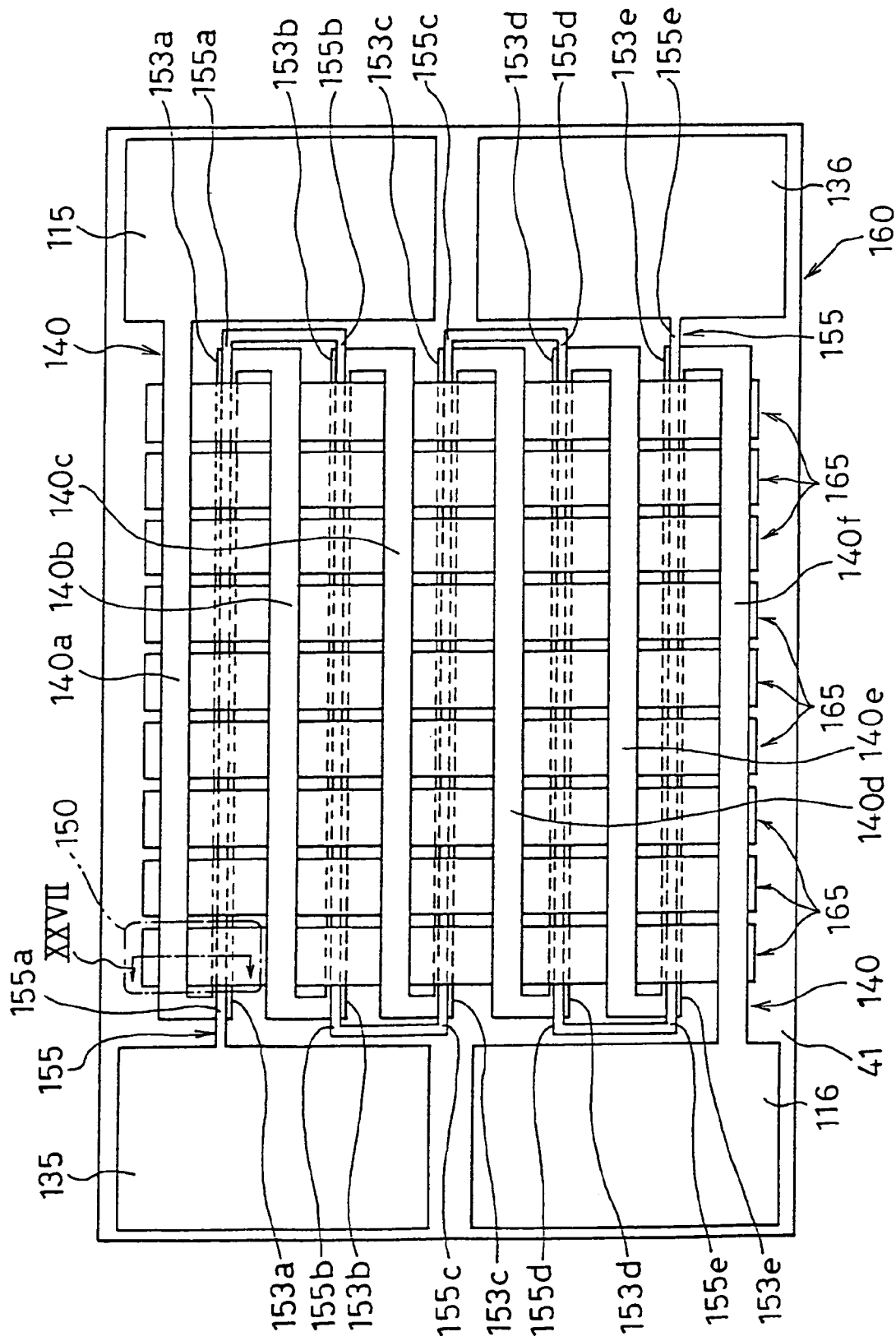
Figure 27:
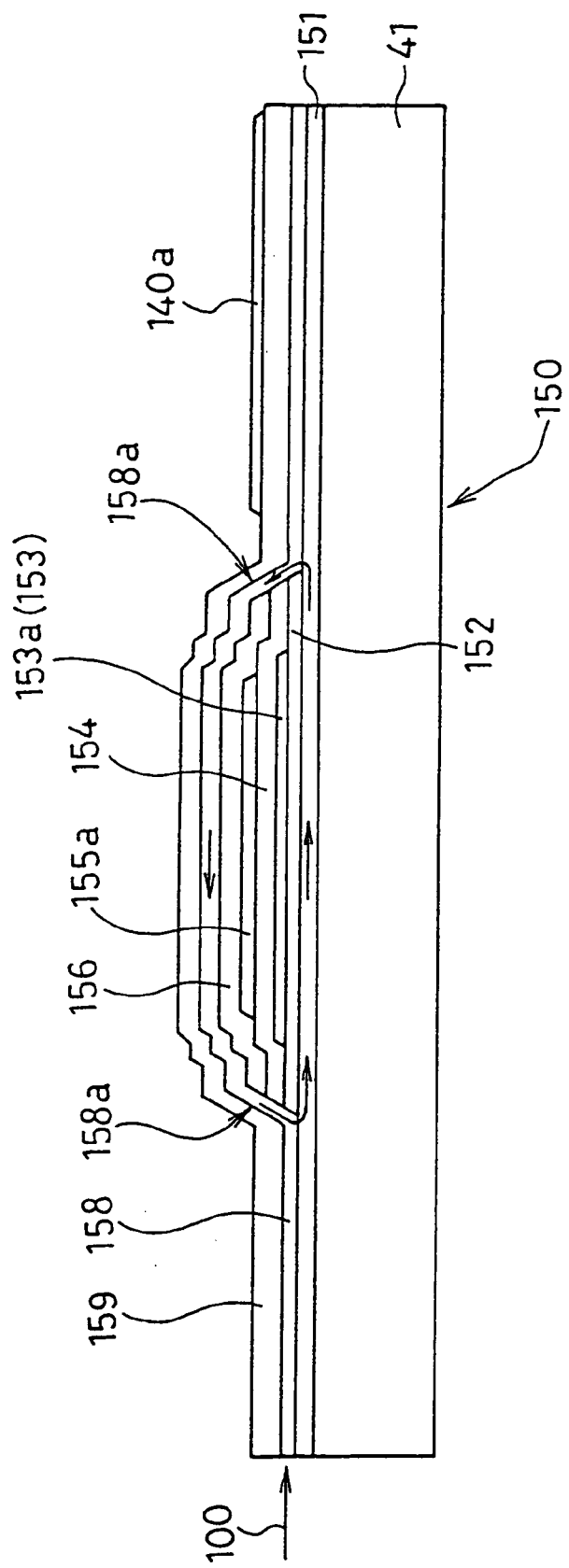
Figure 28:
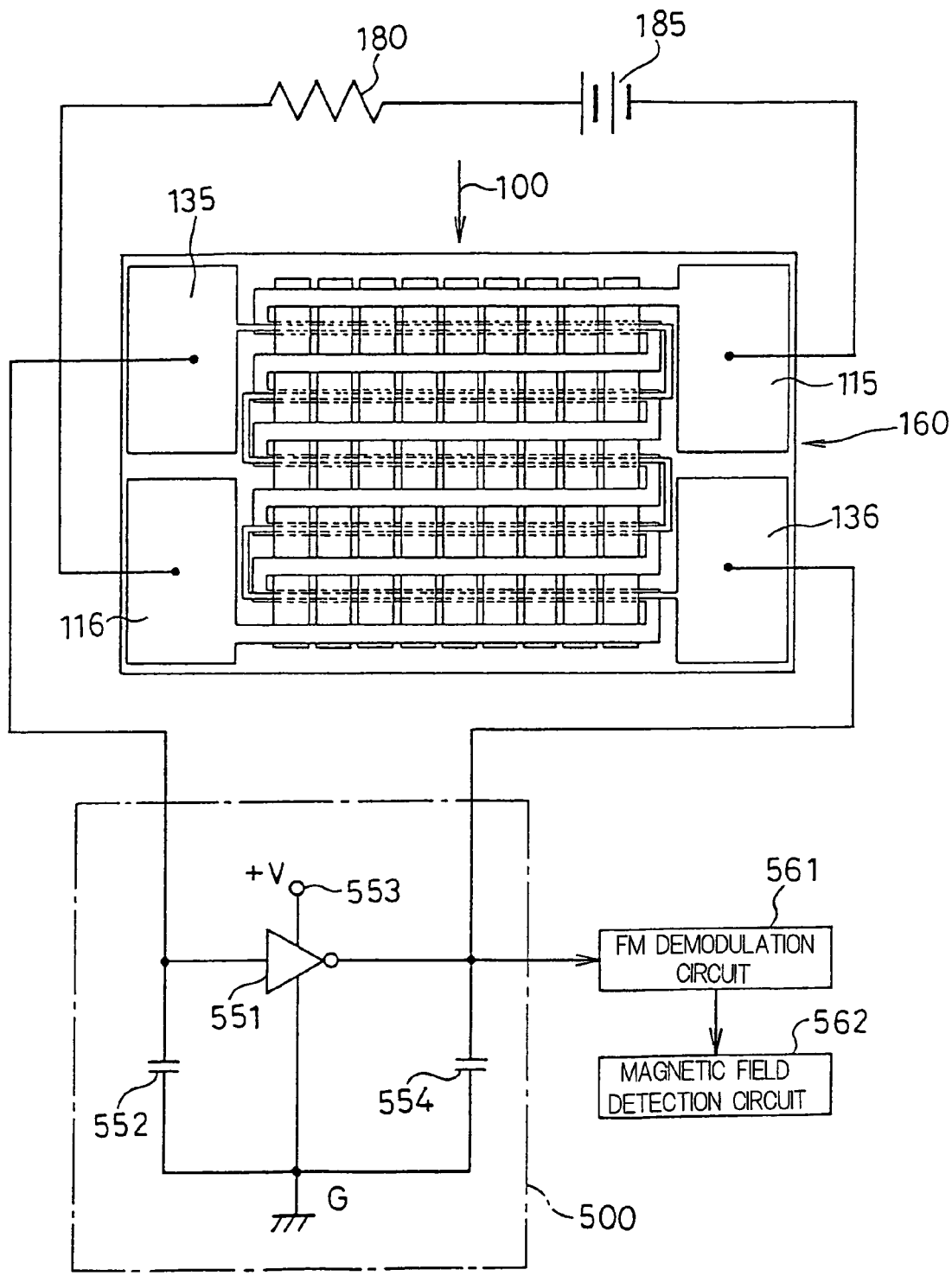
Figure 29:
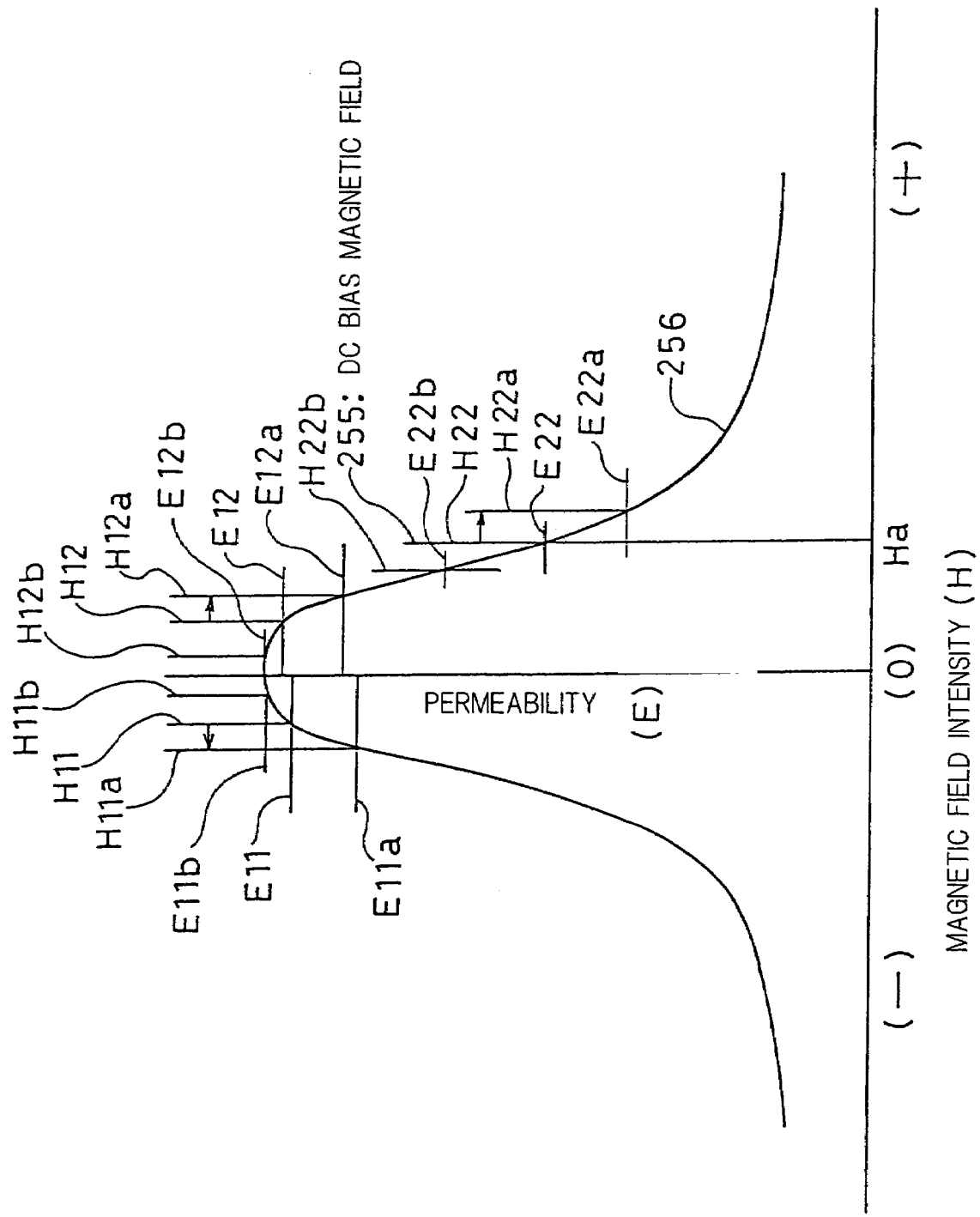
Figure 30:
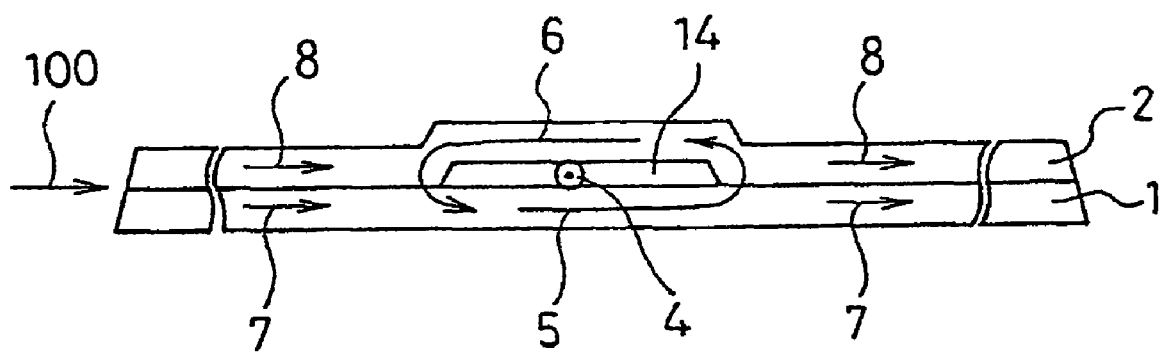
Figure 31:
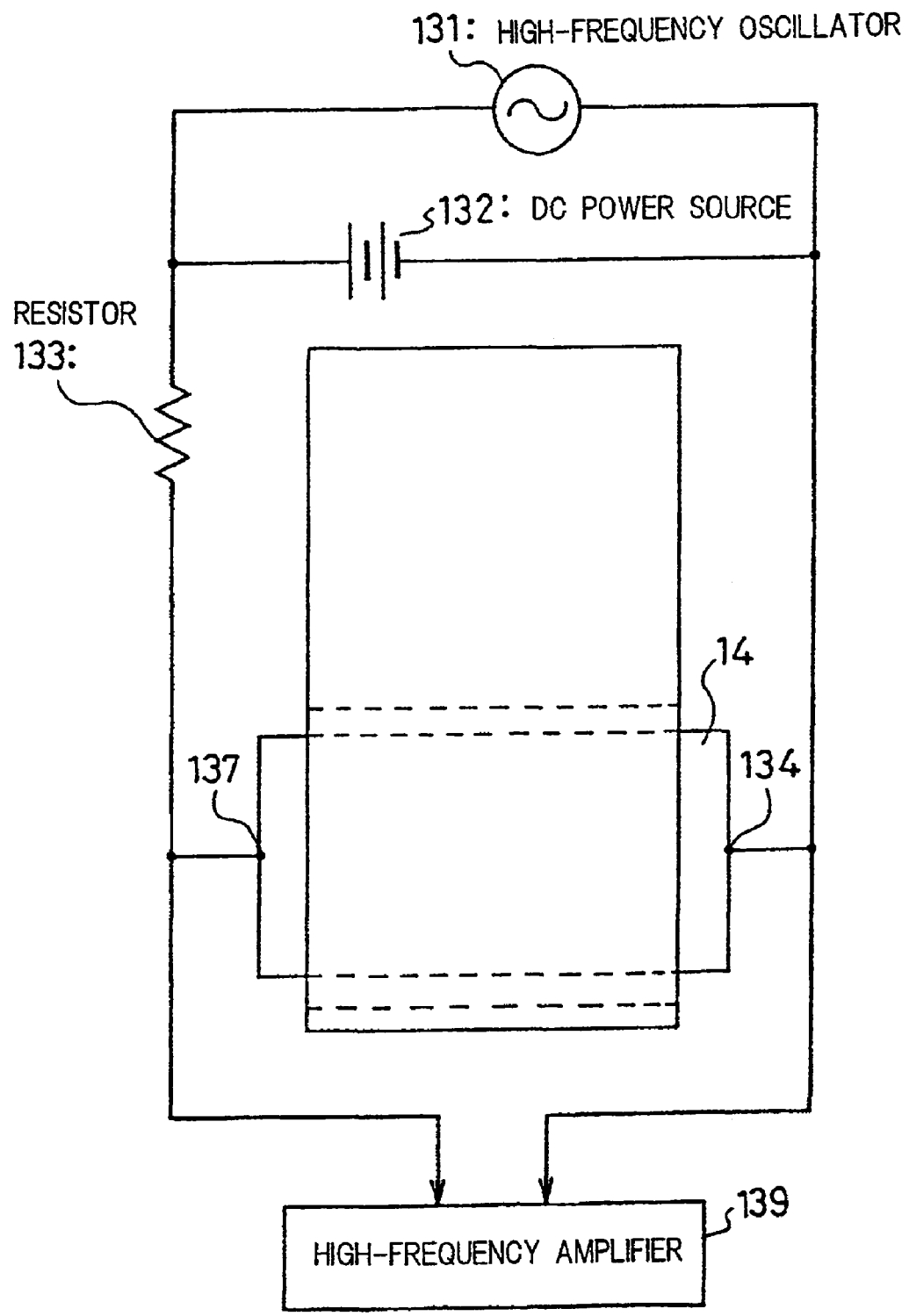

Parts (a) to (c) of FIG. 2 are respectively cross-sectional views showing other examples of the magnetic detection device in accordance with the first embodiment of the present invention;

Parts (a) to (c) of FIG. 3 are cross-sectional views showing the operation of the magnetic detection device in accordance with the first embodiment of the present invention;

Part (a) of FIG. 4 is a cross-sectional view showing another example of the magnetic detection device in accordance with the first embodiment of the present invention;

Part (b) of FIG. 4 is a cross-sectional view showing still another example of the magnetic detection device in accordance with the first embodiment of the present invention;

Parts (a) and (d) of FIG. 5 are respectively a plan view and a cross-sectional view showing still another example of the magnetic detection device in accordance with the first embodiment of the present invention;

FIG. 6 is a cross-sectional view showing still another example of the magnetic detection device in accordance with the first embodiment of the present invention;

FIG. 7 is a cross-sectional view showing still another example of the magnetic detection device in accordance with the first embodiment of the present invention;

Parts (a) and (d) of FIG. 8 are respectively a plan view and a cross-sectional view showing still another example of the magnetic detection device in accordance with the first embodiment of the present invention;

Parts (a) and (d) of FIG. 9 are respectively a plan view and a cross-sectional view showing still another example of the magnetic detection device in accordance with the first embodiment of the present invention;

FIG. 10 is a perspective view showing a magnetic detection device in accordance with a second embodiment of the present invention;

Parts (a) to (c) of FIG. 11 are respectively cross-sectional views showing three examples of the magnetic detection device in accordance with the second embodiment of the present invention;

Parts (a) to (f) of FIG. 12 are cross-sectional views in respective steps of producing the magnetic detection device in accordance with the second embodiment of the present invention;

Parts (a) to (g) of FIG. 13 are cross-sectional views in respective steps of producing another example of the magnetic detection device in accordance with the second embodiment of the present invention;

FIG. 14 is a cross-sectional view showing still another example of the magnetic detection device in accordance with the second embodiment of the present invention;

FIG. 15 is a cross-sectional view showing still another example of the magnetic detection device in accordance with the second embodiment of the present invention;

Parts (a) to (c) of FIG. 16 are respectively cross-sectional views showing three examples of a magnetic detection device in accordance with a third embodiment of the present invention;

FIG. 17 is a graph showing the relationship between the horizontal to vertical ratio and the circumferential length of the cross-section of a conductive wire in accordance with each embodiment of the present invention;

Parts (a) to (e) of FIG. 18 are respectively cross-sectional views showing five examples of a magnetic detection device in accordance with a fourth embodiment of the present invention;

Parts (a) to (c) of FIG. 19 are cross-sectional views showing the operation of the magnetic detection device in accordance with the fourth embodiment of the present invention;

FIG. 20 is a cross-sectional view showing another example of the magnetic detection device in accordance with the fourth embodiment of the present invention;

Part (a) of FIG. 21 is a plan view showing a magnetic detection device in accordance with a fifth embodiment of the present invention;

Part (b) of FIG. 21 is a perspective view of a model of the magnetic detection device in accordance with the fifth embodiment of the present invention;

FIG. 22 is a plan view showing a magnetic detection device in accordance with a sixth embodiment of the present invention;

FIG. 23 is a plan view showing a magnetic detection device in accordance with a seventh embodiment of the present invention;

FIG. 24 is a plan view showing a magnetic detection device in accordance with an eighth embodiment of the present invention;

FIG. 25 is a plan view showing a magnetic detection device in accordance with a ninth embodiment of the present invention;

FIG. 26 is a plan view showing a magnetic detection device in accordance with a tenth embodiment of the present invention;

FIG. 27 is a partially cross-sectional view showing the cross-section of the magnetic detection unit 150 shown in FIG. 26;

FIG. 28 is a circuit diagram of an oscillation-type detection circuit wherein a magnetic detector is configured by using the magnetic detection device in accordance with the tenth embodiment of the present invention:

FIG. 29 is a characteristic curve representing the relationship between the magnetic field intensity (H) and the permeability (E) inside the magnetic cores of the magnetic detector;

FIG. 30 is the cross-sectional view of the magnetic detection device in accordance with the first conventional example;

FIG. 31 is the circuit diagram of the amplification-type detection circuit that is connected to the conductive wire of the magnetic detection device in accordance with each embodiment of the present invention and each conventional example to constitute a magnetic detector;

FIG. 32 is the cross-sectional view of the magnetic detection device in accordance with the second conventional example; and FIG. 33 is the cross-sectional view of the magnetic detection device in accordance with the third conventional example.

BEST MODES FOR CARRYING OUT THE INVENTION

Preferred embodiments of a magnetic detection device in accordance with the present invention will be described below in detail referring to FIGS. 1 to 29. In the cross-sectional views of the magnetic detection devices included in FIGS. 1 to 29, their cross-sections are not hatched for better visibility.

<First Embodiment>

Figure 1:
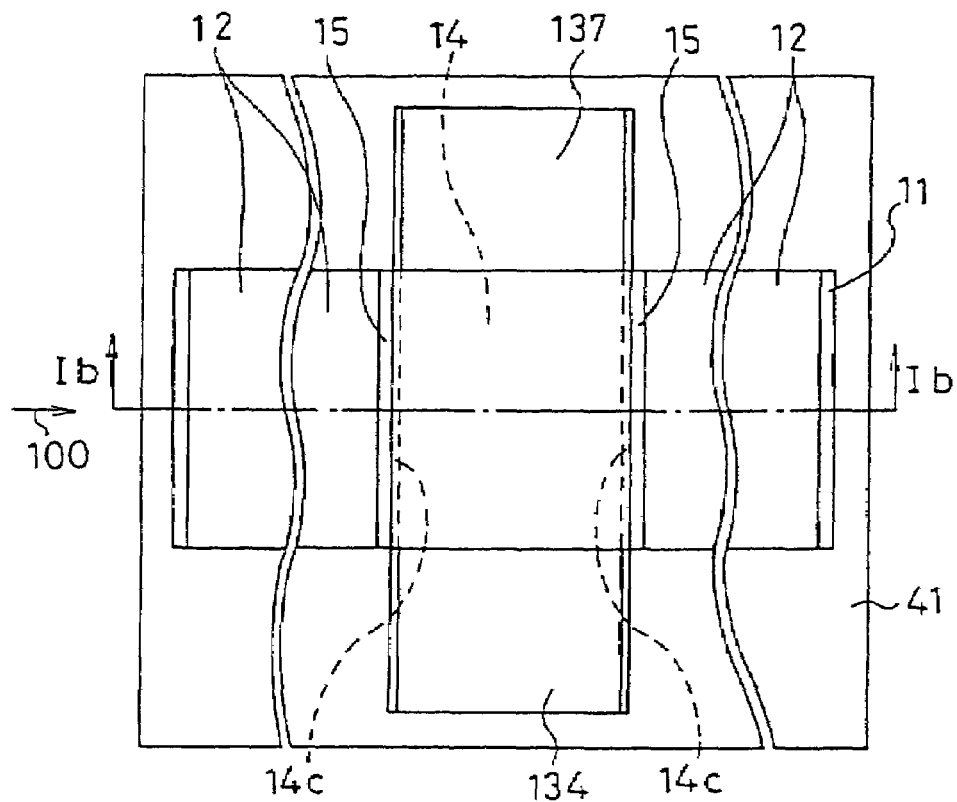
Figure 1:
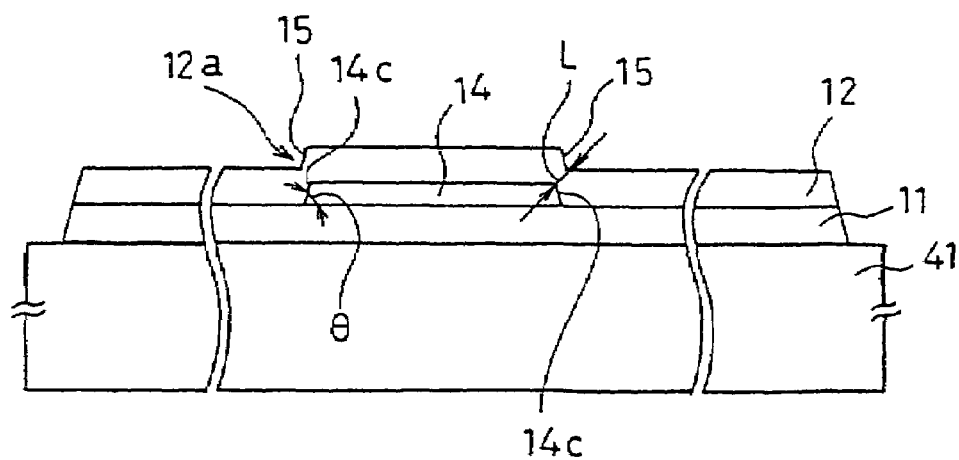

Part (a) of FIG. 1 is a plan view of a magnetic detection device in accordance with a first embodiment of the present invention, and part (b) thereof is a Ib—Ib cross-sectional view of part (a). In the magnetic detection device shown in FIG. 1, a first magnetic core 11 made of a soft magnetic film is formed in a band shape on a substrate 41 made of a nonmagnetic material, such as ceramic. A conductive wire 14 made of a thin film is formed on the magnetic core 11 at the central portion thereof, and a second magnetic core 12 made of a soft magnetic film is formed on the magnetic core 11 and the conductive wire 14. In other words, the conductive wire 14 is held between the magnetic core 11 and the magnetic core 12, and both end portions 134 and 137 of the conductive wire 14 are extended outward. The magnetic core 12 has step portions 12a generated by the conductive wire 14. The step portions 12a of the magnetic core 12 are made thinner than the other portion, that is, the thickness L thereof is about half the thickness of the other portion. Hence, the area of the cross-section perpendicular to a magnetic path at the step portions 12a of the magnetic core becomes smaller than that of the other portion. In order to decrease the thickness L of the step portion 12a, it is desirable that the angle θ of the fringe portion 14c of the conductive wire 14 with respect to the face of the magnetic core 11 should be made close to 90 degrees as shown in part (b) of FIG. 1. Processing for making the angle θ close to 90 degrees can be done by properly selecting the material and thickness of a resist film, etching conditions, etc. when a conductive film is formed on the magnetic core 11 and etched while a portion to become the conductive wire 14 is left by using photoresist. Furthermore, the well-known lift-off method may also be used. In order that the thickness L of the step portion 12a is decreased, the thickness of the magnetic film formed at the fringe portion 14c of the conductive wire 14 can be made smaller by adjusting the film formation conditions of a magnetic film when the magnetic core 12 is formed.

In the magnetic detection device in accordance with this embodiment, the thickness L of the step portion 12a is decreased, whereby the area of the cross-section, perpendicular to a magnetic path, of the magnetic core 12 is made smaller than that of the other portion. In a thin-film formation technology, decreasing the thickness L in the vicinities of the fringe portions 14c of the conductive wire 14 is easiest and low in processing cost. It is desirable that the ratio of the thickness L of the step portion 12a of the magnetic core 12 and the thickness of the other portion of the magnetic core 12 should be 3 to 4 or less. Both the magnetic cores 11 and 12 are soft magnetic films made of FeTaN and having a thickness of 1.5 μm. The conductive wire 14 is a copper film having a right-left width of 10 μm and a thickness of 1 μm. The thickness L is 0.7 μm and the angle θ is 70 degrees after the surface is lapped. As described later in detail, it is desirable that insulation layers should be held between the conductive wire 14 and the magnetic cores 11 and 12.

Parts (a), (b) and (c) of FIG. 2 are cross-sectional views showing other configurations of the magnetic detection device in accordance with this embodiment. In parts (a), (b) and (c) of FIG. 2, the substrate 41 shown in FIG. 1 is not shown.

In the configuration shown in part (a) of FIG. 2, a groove 21 in a direction perpendicular to the face of the paper is formed in the magnetic core 12 in the central region of the conductive wire 14, whereby the thickness of the magnetic core 12 is partially made smaller so that the area of the cross-section perpendicular to a magnetic path (hereafter simply referred to as a cross-sectional area) is made smaller. Hence, a working-effect similar to that of the case wherein the thickness L of the step portion 12a is made thinner, shown in part (b) of FIG. 1, is obtained. Since the groove 21 is obtained by partial removal using etching or the like, the processing is simple.

In the configuration shown in part (b) of FIG. 2, grooves 22 in a direction perpendicular to the face of the paper are formed in the magnetic core 12 in the vicinities of the fringe portions 14c of the conductive wire 14 to make the thickness L smaller. In the configuration shown in part (c) of FIG. 2, grooves 23 in a direction perpendicular to the face of the paper are formed in the vicinities of the fringe portions 14c of the conductive wire 14. Furthermore, grooves 24 reaching the face of the magnetic core 11 are formed so that the portions of the magnetic core 12 enclosing the conductive wire 14 are separated from magnetic cores 12d located at both end portions, thereby making the cross-sectional area smaller. The above-mentioned grooves 21, 22, 23 and 24 can also be formed by ion milling, wet etching, laser processing, etc.

The operation of the magnetic detection device in accordance with this embodiment will be described referring to parts (a), (b) and (c) of FIG. 3. The magnetic detection device 31 shown in parts (a) to (c) of FIG. 3 has the same configuration as that shown in part (b) of FIG. 2. In part (a) of FIG. 3, when the magnetic detection device 31 is placed in a magnetic field having the direction indicated by arrow 100 (hereafter referred to as an external magnetic field 100), the magnetic fluxes indicated by arrows 32 and 33 (hereafter referred to as magnetic fluxes 32 and 33) enter from the left end of the magnetic detection device 31. The magnetic flux densities and the magnetic flux amounts of the magnetic fluxes 32 and 33 are almost equal since the magnetic cores 11 and 12 are made of the same material and have the same thickness, 1.5 μm. The magnetic fluxes 32 and 33 advance rightward inside the magnetic cores 11 and 12, respectively, and reach the portion of the groove 22. Since the thickness of the magnetic core 12 is made smaller by the groove 22, the magnetic paths 34 and 35 through which the magnetic flux of the magnetic core 12 passes have a cross-sectional area smaller than that of the other portion, thereby usually having a larger magnetic flux density. With respect to the relationship between magnetic flux density and permeability, the permeability lowers as the magnetic flux density increases. As the permeability lowers, the inductance of the conductive wire 14 in the vicinities of the grooves 22 decreases.

Parts (b) and (c) of FIG. 3 are cross-sectional views showing the operation of the magnetic detection device 31 in accordance with this embodiment at the time when both ends 134 and 137 of the conductive wire 14 are connected to an amplification-type detection circuit comprising a high-frequency oscillator 131, a DC power source 132 and a high-frequency amplifier 139 as shown in FIG. 31. This configuration is referred to as a "magnetic detector." In parts (a) and (b) of FIG. 3, only the high-frequency oscillator 131 of the circuit shown in FIG. 31 is operated, and an AC current (carrier current) is flown into the conductive wire 14 in a direction perpendicular to the face of the paper. The magnetic flux generated by the AC current is indicated by a broken line 37 (hereafter referred to as a magnetic flux 37). The magnetic flux 37 is formed so as to enclose the conductive wire 14. Since the permeabilities of the magnetic cores 11 and 12e, occupying the major part of the magnetic path, are high, the inductance of the conductive wire 14 is relatively high. In order to keep the inductance high, the length of the magnetic path 37 should be relatively smaller. Since the inductance of the conductive wire 14 is proportional to the permeabilities of the magnetic cores 11 and 12e, the inductance changes depending on the intensity of the external magnetic field indicated by arrow 100. The impedance of the conductive wire 14 is changed by the change of the inductance of the conductive wire 14, whereby the amplitude of the carrier current changes. The intensity of the external magnetic field can be detected depending on the level of the carrier signal output when the output voltage across both ends 134 and 137 of the conductive wire 14 depending on the change of the amplitude of the carrier current is amplified and detected by the high-frequency amplifier 139 shown in FIG. 31. Since the magnetic detection device having the configuration shown in part (a) of FIG. 2 has one groove 21, the magnetic flux generated by a high-frequency current tends to pass easily, whereby the inductance of the conductive wire 14 is high. Hence, the magnetic field detection sensitivity thereof is higher than that of the magnetic detection device shown in part (b) of FIG. 2.

In the magnetic detection device shown in part (b) of FIG. 3, the output having the same level can be obtained even when the direction of the external magnetic field 100 is opposite to the direction indicated by the arrow in the figure, that is, the left direction. Therefore, the direction of the external magnetic field 100 cannot be distinguished. Next, a bias magnetic field for distinguishing the direction will be described.

Part (c) of FIG. 3 is a cross-sectional view showing a DC bias magnetic flux 38 in the case when a DC bias current is flown from front to rear in a direction perpendicular to the paper face through the conductive wire 14 by the DC power source 132 shown in FIG. 31. Since the DC bias magnetic fluxes pass through the magnetic cores 11 and 12 in directions opposite to each other, the difference in permeability is small. A carrier current is also made flow through the conductive wire 14 by the high-frequency oscillator 131. By the carrier current flowing through the conductive wire 14, a carrier signal, a high-frequency voltage, is generated across both ends of the conductive wire 14. By the DC bias magnetic flux 38 passing through the magnetic cores 11 and 12 around the conductive wire 14, a DC bias magnetic field is generated. In the magnetic core 12, the cross-sectional areas of the magnetic paths 34 and 35 are smaller than that of the other portion, the DC bias magnetic flux density is high. FIG. 29 is a characteristic curve 256 indicating the relationship between the magnetic field intensities (H) caused by the DC bias magnetic fluxes passing through the magnetic cores 11e and 12e and the permeabilities (E) of the magnetic cores 11 and 12 in the magnetic detection device 31 to which the DC bias magnetic field is applied. The signs (+) and (−) on the horizontal axis indicate the directions of the DC bias magnetic flux 38 with respect to the direction of the external magnetic field 100; (+) indicates the same direction, and (−) indicates the opposite direction. In the characteristic curve 256 shown in FIG. 29, when the value of the DC current flowing through the conductive wire 14 is set so that the magnetic field intensity H of the DC bias magnetic field 255 becomes the magnetic field intensity Ha obtained at the portion wherein the inclination of the characteristic curve 256 is largest, the changes of the permeabilities (E) of the magnetic cores 11 and 12 depending on the change of the magnetic field intensity (H) become largest. The intensity of the DC bias magnetic field in this state is referred to as "appropriate DC bias magnetic field intensity Ha."

In the magnetic core 12 shown in part (c) of FIG. 3, since the cross-sectional areas of the magnetic paths 34 and 35 are smaller than that of the other portion, the density of the DC bias magnetic flux 38 is higher than that of the other portion, and the magnetic field intensity is also higher. The magnetic field intensity at the magnetic paths 34 and 35 is set so as to be the appropriate DC bias magnetic field intensity Ha by adjusting the DC bias current. At this time, the magnetic field intensities at the other portions of the magnetic cores 11 and 12, having cross-sectional areas larger than those of the magnetic paths 34 and 35, are lower than the appropriate DC bias magnetic field intensity Ha.

In part (c) of FIG. 3, the magnetic field intensities determined by the densities of the magnetic fluxes of the magnetic cores 11e and 12e enclosing the conductive wire 14 and the magnetic field intensity determined by the density of the magnetic flux passing through the magnetic paths 34 and 35 of the grooves 22 are represented by H11, H12 and H22, respectively. The changes of the magnetic field intensities H11, H12 and H22 at the time when the intensity and direction of the external magnetic field 100 are changed will be described referring to FIG. 29.

In FIG. 29, when the external magnetic field 100 does not exist, the magnetic field intensity H22 is equal to Ha (H22=Ha) since the magnetic paths 34 and 35 are set to have the appropriate DC bias magnetic field intensity Ha. Since the densities of the DC bias magnetic fluxes of the magnetic cores 11e and 12e having cross-sectional areas larger than those of the magnetic paths 34 and 35 are lower than the magnetic flux densities of the magnetic paths 34 and 35 at this time, the magnetic field intensities H11 and H12 are also lower than the magnetic field intensity H22 as shown in the figure. E22 designates a permeability corresponding to the magnetic field intensity H22. E11 designates a permeability corresponding to the magnetic field intensity H11, and E12 designates a permeability corresponding to the magnetic field intensity H12. At this time, the impedance of the conductive wire 14 is a value determined by the permeability E22 corresponding to the magnetic field intensity Ha.

When a magnetic detector in this state is placed in the external magnetic field 100 as shown in part (c) of FIG. 3, the magnetic flux 36 generated by the external magnetic field 100 passes through the magnetic core 11, and a magnetic flux 33a passes through the magnetic core 12. By the magnetic fluxes 36 and 33a, the magnetic field intensities H11, H12 and H22 change as respectively indicated by arrows as shown in FIG. 29. In other words, the magnetic field intensity H11 decreases to H11b, and both the magnetic field intensities H12 and H22 increase to magnetic field intensities H12a and H22a, respectively. All the permeabilities E11, E12 and E22 decrease to permeabilities E11a, E12a and E22a, respectively. As a result, the impedance across both terminals 134 and 137 of the conductive wire 14 lowers, and the level of the carrier signal lowers.

In the case when the direction of the external magnetic field is directed from right to left in part (c) of FIG. 3, that is, the direction indicated by arrow 200, the magnetic field intensity H11 increases to H11a in FIG. 29. Both the magnetic field intensities H12 and H22 decrease to magnetic field intensities H12b and H22b, respectively. The changes of the magnetic field intensities H11 and H12 only slightly contribute to the changes of permeabilities; however, as the result of the change of the magnetic field intensity H22 to H22b, the permeability E22 increases greatly to permeability E22b. When the direction of the external magnetic field changes in this way, the permeability of the magnetic paths 34 and 35, the cross-sectional areas of which are made smaller by the grooves 22 as shown in part (c) of FIG. 3, changes greatly, whereby the direction of the external magnetic field 100 can be detected. The level of the carrier signal across both terminals 134 and 137 of the conductive wire 14 changes depending on the change of the impedance of the conductive wire 14, which is proportional to the change of the permeability. By amplifying and detecting the high-frequency voltage of this carrier signal using the high-frequency amplifier 139, the direction and intensity of the external magnetic field 100 can be detected as an electrical signal.

As other examples of the magnetic detection device in accordance with this embodiment, devices shown in parts (a) and (b) of FIG. 4 and in parts (a) and (b) of FIG. 5 are available. In the magnetic detection device shown in part (a) of FIG. 4, the film thickness of the magnetic core 11 on the lower side of the conductive wire 14 is made smaller than the film thickness of the magnetic core 12 on the upper side thereof so that its cross-sectional area is made smaller.

In the magnetic detection device shown in part (b) of FIG. 4, the film thickness of the magnetic core 12 on the upper side of the conductive wire 14 is made smaller than the film thickness of the magnetic core 11 so that its cross-sectional area is made smaller. In the magnetic detection devices shown in parts (a) and (b) of FIG. 4, the film thickness of the magnetic core 11 or 12 should only be made smaller in a film formation process, whereby the processing is simple. Since the film thickness of one of the magnetic cores 11 and 12 is made smaller than that of the other, the magnetic field intensity in the vicinity of the conductive wire 14 rises, whereby even the devices shown in parts (a) and (b) of FIG. 4 can obtain an effect similar to that of the magnetic detection device in accordance with this embodiment.

Parts (a) and (b) of FIG. 5 are a plan view and a cross-sectional view, respectively, of another example. In this magnetic detection device, the width W1 of a magnetic core 12g is made smaller at the portion on the conductive wire 14 than the width W2 of the other portion. The thicknesses of the magnetic cores 11 and 12g are the same. Since the width W1 is made smaller than the width W2 of the other portion, the cross-sectional area of the magnetic core 12 decreases at the portion on the conductive wire 14, whereby the same effect as that obtained when the film thickness of the magnetic core 11 or 12 is made smaller as shown in part (a) or (b) of FIG. 4 is obtained.

FIG. 6 is a cross-sectional view of another example of the magnetic detection device in accordance with the first embodiment. In this example, a groove 21b in a direction perpendicular to the face of the paper is formed in the lower face of a magnetic core 11b disposed on the lower side, and the cross-sectional area of the magnetic core 11b is made smaller at this portion than that of the other portion.

FIG. 7 is a cross-sectional view of still another example of the magnetic detection device in accordance with this embodiment. In this example, a groove 21d in a direction perpendicular to the face of the paper is formed in the upper face of a magnetic core 11c disposed on the lower side, and the cross-sectional area is made smaller than that of the other portion.

Parts (a) and (b) of FIG. 8 are a plan view and a VIIIb—VIIIb (Sic) cross-sectional view, respectively, of still another example of the magnetic detection device. In this example, a circular or elliptic hole 61 is formed in a magnetic core 12j disposed on the upper side at a portion contacting the conductive wire 14. Since the hole 61 is formed, the cross-sectional area of the magnetic core 12j is made smaller at this portion. By changing the area of the hole 61, this portion of the magnetic core 12j can have a desired cross-sectional area.

Parts (a) and (b) of FIG. 9 are a plan view and a IXb—IXb cross-sectional view, respectively, of still another example of the magnetic detection device. In this example, a circular or elliptic depressed portion 62 is formed in the upper face of a magnetic core 12j disposed on the upper side. By changing the area and depth of the depressed portion 62, this portion of the magnetic core can have a desired cross-sectional area. The shape of the hole 61 or the depressed portion 62 is not limited to be circular or elliptic, but other shapes may be used.

In accordance with this embodiment, a portion having a smaller cross-sectional area is provided partially by forming the grooves 22 in the magnetic core 12 in the vicinities of the fringe portions of the conductive wire 14 or by taking other measures, whereby the change of the permeability of the magnetic core 12e in the vicinity of the conductive wire 14 depending on the change of the external magnetic field 100 increases. As a result, the change of the impedance of the conductive wire 14 increases, and the detection sensitivity of the magnetic detection device rises. The principle of detecting an external magnetic field in each embodiment described below is the same as that of this embodiment.

<Second Embodiment>

A magnetic detection device in accordance with a second embodiment of the present invention will be described referring to FIGS. 10 to 15.

FIG. 10 is a perspective view of the magnetic detection device in accordance with the second embodiment of the present invention. Part (a) of FIG. 11 is a cross-sectional view of the magnetic detection device shown in FIG. 10, taken on line XIa—XIa.

Parts (b) and (c) of FIG. 11 are cross-sectional views of two other examples of the magnetic detection device in accordance with the second embodiment of the present invention, respectively.

In FIG. 10 and part (a) of FIG. 11, a first magnetic core 44 made of a soft magnetic film is formed on a nonmagnetic substrate 41 made of ceramic or the like. A first insulation film 42 made of a $SiO_2$ film having a thickness of 0.1 μm is formed on the magnetic core 44 in the central region thereof, and a conductive wire 14 is formed thereon so as to stride the magnetic core 44. A second insulation film 43 made of a $SiO_2$ film having a thickness of 0.1 μm is formed on the conductive wire 14, and a second magnetic core 12 is formed thereon. On the magnetic core 44 at both end portions of the substrate 41, second magnetic cores 45 made of soft magnetic films are formed at portions away from the magnetic core 12. The preferred thickness of both the magnetic cores 44 and 45 is 1.5 μm. The cross-sectional area of the magnetic core 12 at the step portions 12a of the magnetic core 12 is made smaller than that of the other portion.

In the configuration of this embodiment, the second magnetic core 12 is provided only on the conductive wire 14 and at the circumference thereof. Since a magnetic core 11 is formed by laminating the magnetic cores 44 and 45 in the end region T, the film thickness of the magnetic core 11 is 3 μm at the magnetic flux inflow portion 40 located at the end portion of the substrate 41. Since only the magnetic core 44 having a film thickness of 1.5 μm is present in the central region 46a in the vicinity of the conductive wire 14, when a magnetic flux flowing from the magnetic flux inflow portion 40 located at the end portion of the magnetic core 11 having a film thickness of 3 μm passes through the magnetic core 44 having a film thickness of 1.5 μm, the density of the magnetic flux is approximately doubled. The magnetic flux density of the magnetic core 12 increases corresponding to the increase of the magnetic flux density of the magnetic core 44. Because of the increase of this magnetic flux density, the change of the magnetic flux density depending on an external magnetic field 100 is approximately doubled in comparison with the case wherein the film thickness of the magnetic core 44 in the end region T is the same as that in the central region 46a, as a result, the detection sensitivity rises.

In the example shown in part (b) of FIG. 11, after the magnetic core 44 having a thickness of 3 μm is formed on the substrate 41, the surface portion of the central region 46a of the magnetic core 44 is removed so that the thickness is made thin to about 1.5 μm. On the magnetic core 44 in the end region T, the magnetic core 45 having a thickness of 1.5 μm is formed at a portion away from the magnetic core 12. The other configuration is the same as that shown in part (a) of FIG. 11. In this example, the film thickness of the magnetic flux inflow portion 40 at the end portion of the substrate 41 is 4.5 μm, and the film thickness of the magnetic core 44 at the central region 46a in the vicinity of the conductive wire 14 is 1.5 μm, whereby the thicknesses ratio is three. As a result, the magnetic flux density in the central region 46a of the magnetic core 44 is about three times as high as that in the end region T, and sensitivity is raised further.

In parts (a) and (b) of FIG. 11, the insulation film 42 is provided between the first magnetic core 44 and the second magnetic core 12 to provide electrical insulation; however, it is not always necessary to provide electrical insulation therebetween. If the insulation film 42 is too thick, the magnetic path becomes longer, and the inductance of the conductive wire 14 lowers; this is undesirable.

In the example shown in part (c) of FIG. 11, grooves 47 in a direction perpendicular to the face of the paper are formed at the step portions 12a of the magnetic core 12 shown in part (b) of FIG. 11. By forming the grooves 47, the film thickness of the inclined portions of the magnetic core 12 is made smaller, and the cross-sectional area thereof is made smaller. In the case that detection sensitivity is desired to be as high as possible, it is desirable to provide the thin insulation film 42. When a magnetic detector is configured by using the magnetic detection device in accordance with this embodiment, the device is connected to the detection circuit shown in FIG. 31, and a DC current and a high-frequency current are flown into the conductive wire 14.

Parts (a) to (f) of FIG. 12 are cross-sectional views in respective steps of a method of producing the magnetic detection device in accordance with the second embodiment shown in part (a) of FIG. 11. In part (a) of FIG. 12, a soft magnetic film having a thickness of 1.5 μm is formed on the substrate 41 made of nonmagnetic ceramic by sputtering, and the first magnetic core 44 having a desired shape is formed by ion milling.

In part (b) of FIG. 12, a $SiO_2$ film having a thickness of 0.1 μm is formed by sputtering in the central region of the magnetic core 44 and then subjected to ion milling so as to have a desired shape, whereby the first insulation film 42 is formed.

In part (c) of FIG. 12, a Cu film having a thickness of 1.0 μm is formed by sputtering in the central region of the insulation film 42 and then subjected to ion milling so as to have a desired shape, whereby the conductive wire 14 is formed.

In part (d) of FIG. 12, a $SiO_2$ film having a thickness of 0.1 μm is formed by sputtering on the conductive wire 14 and then subjected to ion milling so as to have a desired shape, whereby the second insulation film 43 is formed.

In part (e) of FIG. 12, a soft magnetic film having a thickness of 1.5 μm is formed by sputtering on the insulation films 42 and 43 and in the end regions of the magnetic core 44 and then subjected to ion milling, whereby the second magnetic core 12 and the first magnetic cores 45 are formed.

In part (f) of FIG. 12, a $SiO_2$ film having an average thickness of 3 μm is formed by sputtering on the entire face of the substrate 41, including the magnetic cores 12 and 45. Next, it is subjected to ion milling as to have a desired shape, whereby a protective film 51 is formed and terminals and the like, not shown, are provided; this completes the film formation process. In the end, cutting is carried out so that a desired shape is obtained, whereby the magnetic detection device in accordance with this embodiment is obtained.

The substrate 41 is made of nonmagnetic ceramic including nickel, titanium and magnesium. It is desirable that a lamination wherein $SiO_2$ films serving as interlayer insulation films are held among a plurality of layers made of an alloy including iron, tantalum and nitrogen should be used as the soft magnetic film.

Parts (a) to (g) of FIG. 13 are cross-sectional views in respective steps of a method of producing the magnetic detection device shown in part (b) of FIG. 11.

In part (a) of FIG. 13, a soft magnetic film having a thickness of 3 μm is formed by sputtering on the substrate 41 made of ceramic, and the first magnetic core 44 having a desired shape is formed by ion milling.

In part (b) of FIG. 13, the surface portion in the central region of the magnetic core 44 is removed by ion milling in a range slightly larger than the region of a $SiO_2$ film that is formed in the next step, whereby a depressed portion 46 having a depth of 1.5 μm is formed.

In part (c) of FIG. 13, a $SiO_2$ film having a thickness of 0.1 μm is formed by sputtering on the depressed portion 46 and then subjected to ion milling so as to have a desired shape, whereby the first insulation film 42 is formed.

In part (d) of FIG. 13, a Cu film having a thickness of 1.0 μm is formed by sputtering in the central region of the insulation film 42 and then subjected to ion milling so as to have a desired shape, whereby the conductive wire 14 is formed.

In part (e) of FIG. 13, a $SiO_2$ film having a thickness of 0.1 μm is formed by sputtering so as to cover the conductive wire 14 and then subjected to ion milling so as to have a desired shape, whereby the second insulation film 43 is formed.

In part (f) of FIG. 13, a soft magnetic film having a thickness of 1.5 μm is formed by sputtering on the insulation films 42 and 43 and in the end regions of the magnetic core 44. Next, it is subjected to ion milling so as to have desired shapes, whereby the second magnetic core 12 and the first magnetic cores 45 are formed.

In part (g) of FIG. 13, a $SiO_2$ film having a thickness of 3 μm is formed by sputtering on the entire face including the magnetic cores 12 and 45, and then subjected to ion milling so as to have a desired shape, whereby the protective film 51 is formed.

In the end, unnecessary portions (not shown) are cut off so that a desired shape is obtained, whereby a magnetic detection device is completed.

The ceramic used for the substrate 41 is a nonmagnetic material including nickel, titanium and magnesium. It is desirable that a lamination wherein $SiO_2$ films serving as interlayer insulation films are held among a plurality of layers made of an alloy including iron, tantalum and nitrogen should be used as the soft magnetic film.

It may be possible that after the step shown in part (a) of FIG. 13 the soft magnetic film is formed by sputtering and then subjected to ion milling so that the magnetic core 45 is formed.

In the magnetic detection device shown in part (a) of FIG. 11, the insulation film 42 may also be provided between the magnetic core 44 and the magnetic core 12 as shown in FIG. 14 to provide insulation between the magnetic core 44 and the magnetic core 12.

FIG. 15 is a cross-sectional view of another example of the magnetic detection device in accordance with this embodiment. In this magnetic detection device, a depressed portion is formed in the central region of a magnetic core 11k so that the cross-sectional area is made smaller, and the conductive wire 14 is formed therein. A magnetic core 12k is formed on the magnetic core 11k and the conductive wire 14. Although the production process for the magnetic detection device shown in FIG. 15 differs from that shown in FIG. 14, there is little difference therebetween in characteristics.

<Third Embodiment>

A magnetic detection device in accordance with a third embodiment of the present invention will be described referring to parts (a) and (c) of FIG. 16, cross-sectional views. Part (b) of FIG. 16 is a view for comparative description. In parts (a), (b) and (c) of FIG. 16, the substrate 41 shown in FIG. 10 is not shown. The magnetic detection device in accordance with this embodiment shown in parts (a) and (c) of FIG. 16 has a configuration similar to that shown in part (b) of FIG. 1 in accordance with the above-mentioned first embodiment, and comprises first and second magnetic cores 11 and 12 made of a soft magnetic film and a conductive wire 14 or 34 made of a conductive film and held between the magnetic cores 11 and 12 at the central portions thereof. This embodiment differs from the first embodiment in that the film thickness of the conductive wire 14 or 34 is larger than the film thickness of the second magnetic core 12.

In part (a) of FIG. 16, the film thickness of the conductive wire 14 is made larger than the film thickness of the magnetic core 12, whereby in the path 71 indicated by a broken line passing through the points 14a and 14b of the fringe portions of the conductive wire 14, the length of the magnetic path 12d passing through the magnetic core 12 becomes larger than the magnetic path 11d passing through the magnetic core 11. In addition, the conductive wire 14 is made thicker, whereby the thickness of the magnetic core 12 at the inclined portions 14c of the conductive wire 14 becomes smaller than that of the other portion when film formation is carried out by sputtering; hence, the cross-sectional area thereof becomes smaller than that of the other portion. Part of a magnetic flux 33 flown into the magnetic core 12 from an external magnetic field 100 moves to the magnetic core 11 having a higher permeability since the path is shorter in the vicinity of the point 14a. In other words, the magnetic filed line takes the shorter path. The magnetic flux moved from the magnetic core 12 to the magnetic core 11 joins together with a magnetic flux 32 flown into the magnetic core 11 and passes through the magnetic path 11d. As a result, the magnetic flux density of the magnetic path 11d becomes higher than the magnetic flux density of the magnetic path 12d, whereby the detection sensitivity for the external magnetic field rises.

Part (b) of FIG. 16 shows an example, similar to the above-mentioned first embodiment, wherein the thickness of the conductive wire 24 is 1 µm (10 µm in width) and the thicknesses of the magnetic cores 11 and 12 are less than 1.5 µm. In this example, in the path 73 indicated by a broken line passing between the points 24a and 24b, there is not much difference between the magnetic path passing through the magnetic core 11 and the magnetic path passing through the magnetic core 12.

Part (c) of FIG. 16 shows an example wherein the thickness of the conductive wire 34 is 2 µm, the width thereof is 5 µm, and the thicknesses of the magnetic cores 11 and 12 are 1.5 µm. Since the conductive wires 24 and 34 have the same cross-sectional area, their DC resistances per unit length are equal. In the example shown in part (c) of FIG. 16, the thickness of the conductive wire 34 is made far larger than the thickness of the magnetic core 12 and the width thereof in the right-left direction is made smaller, whereby between the points 34a and 34b there is much difference in length between the magnetic path 12c passing through the magnetic core 12 and the magnetic path 11c passing through the magnetic core 11. As a result, the magnetic flux density of the magnetic path 11c becomes far larger than that of the magnetic path 12c. The change of the impedance of the conductive wire 34 depending on the external magnetic field becomes larger than the change of the impedance of the conductive wire 14 shown in part (a) of FIG. 16, whereby further higher detection sensitivity is obtained.

The respective inductances of the conductive wires 24 and 34 are reversely proportional to the length of the entire magnetic path around the conductive wire 24 or 34. When the entire magnetic path of the device shown in part (b) of FIG. 16 with the entire magnetic path of the device shown in part (c) of FIG. 16, the entire magnetic path shown in part (c) of FIG. 16 is shorter, whereby the inductance of the conductive wire 34 is larger than that of the conductive wire 24. The change of the impedance of the conductive wire depending on the external magnetic field at the time when a high-frequency current is flown into the conductive wire becomes larger as the inductance of the conductive wire is larger; hence, also from this point of view, the magnetic detection sensitivity of the magnetic detection device shown in part (c) of FIG. 16 becomes higher.

FIG. 17 is a graph showing the relationship between the circumferential length (on the vertical axis) of a conductive wire having a rectangular cross-section and having a constant cross-sectional area and the ratio b/a (on the horizontal axis) of the vertical side (a) and the horizontal side (b) of the cross-section. In order that the circumferential length of the conductive wire is made as small as possible, it is desirable that the ratio b/a should be set at about 4. The circumferential length becomes smallest when the ratio b/a is one (square); however, in this case, the film thickness becomes larger, whereby long time is required for film formation and etching, and production cost becomes high. From the above-mentioned points of view, it is desirable that the ratio (thickness/length) of the film thickness (a) and the length (b) of each of the conductive wires 14 and 34 should be ¼ or more. A magnetic detector incorporating the magnetic detection device in accordance with this embodiment is configured by using the detection circuit shown in FIG. 31, and a DC current is flown into the conductive wire to apply DC magnetic bias.

<Fourth Embodiment>

A magnetic detection device in accordance with a fourth embodiment of the present invention will be described referring to FIGS. 18 to 20.

Parts (a) to (e) of FIG. 18 are cross-sectional views of five examples of the magnetic detection device in accordance with the fourth embodiment of the present invention. Part (a) of FIG. 18 is a cross-sectional view of a first example of the magnetic detection device in accordance with this embodiment. In the figure, conductive wires 84 and 85 are provided on both faces of a first magnetic core 81 at the central portion thereof. A second magnetic core 82 is formed on the upper faces of the conductive wire 84 and the magnetic core 81, and a third magnetic core 83 is formed on the lower faces of the conductive wire 85 and the magnetic core 81. The magnetic cores 81, 82 and 83 are all made of the same material and have the same thickness. In the magnetic detection device in accordance with this embodiment, either the magnetic core 82 or 83 may be provided on a substrate although the substrate 41 used in the above-mentioned first and second embodiments is not shown. For example, in the case when the magnetic core 83 is formed on a substrate, in order to accommodate the projected portion 83p at the central portion of the magnetic core 83, a depressed portion having a shape conforming to the shape of the projected portion 83p is formed in the face of the substrate. As another method, a layer having a depressed portion having a shape conforming to the shape of the projected portion 83p and made of a nonmagnetic insulator may be formed on the substrate. This matter is similarly applicable to the examples shown in parts (b) to (e) of FIG. 18. In the case when no substrate is used, the magnetic cores 81, 82 and 83 and the conductive wires 84 and 85 are made of relatively thick films or the like not requiring the substrate 41. In the magnetic detection device shown in part (b) of FIG. 18, the horizontal to vertical ratio of the cross-sections of conductive wires 84a and 85a is set at about 1 to 2. The other configuration is the same as that shown in part (a) of FIG. 18.

In the magnetic detection device shown in part (c) of FIG. 18, grooves 22 are formed in second and third magnetic cores 82a and 83a in the vicinities of the fringe portions of conductive wires 84 and 85 to reduce the cross-sectional areas. The conductive wires 84 and 85 are the same as those shown in part (a) of FIG. 18.

In the magnetic detection device shown in part (d) of FIG. 18, depressed portions 21 are formed at the central portions of second and third magnetic cores 82b and 83b to reduce the cross-sectional areas. Conductive wires 84 and 85 are the same as those shown in part (a) of FIG. 18.

In the magnetic detection device shown in part (e) of FIG. 18, magnetic cores 82c and 83c are provided on both faces of a magnetic core 81 at both end portions thereof. Conductive wires 84 and 85 are provided on both faces of the magnetic core 81 at the central portion thereof. A magnetic core 82d is formed so as to cover the conductive wire 84 while a clearance is maintained from the magnetic cores 82c. In addition, a magnetic core 83d having grooves 23 is formed so as to cover the conductive wire 85 while a clearance is maintained from the magnetic cores 83c.

The operation of the magnetic detection device in accordance with this embodiment will be described referring to FIG. 19 by taking the device shown in part (c) of FIG. 18 as an example. In part (a) of FIG. 19, when the magnetic detection device in accordance with this embodiment is placed in an external magnetic field 100, magnetic fluxes indicated by arrows 91, 92 and 93 and having almost the same density (hereafter referred to as magnetic fluxes 91, 92 and 93) pass through the magnetic cores 81, 82 and 83, respectively. A magnetic detection device equivalent to that shown in part (b) of FIG. 2 is configured by the conductive wire 84 and the magnetic core 81 and 82. In addition, another magnetic detection device equivalent to that shown in part (b) of FIG. 2 is configured by the conductive wire 85 and the magnetic core 81 and 83.

In this embodiment, the conductive wires 84 and 85 are connected in series and further connected across the terminals 134 and 137 of the detection circuit shown in FIG. 31, and a high-frequency current is flown from the high-frequency oscillator 131 in a direction perpendicular to the face of the paper. In part (b) of FIG. 19, ellipses indicated by broken lines 97 and 98 designate AC magnetic fields generated around the conductive wires 84 and 85 by the high-frequency current. Part (c) of FIG. 19 shows magnetic fluxes, by using arrows, obtained at the time when DC bias magnetic fields are generated by flowing DC currents into the conductive wires 84 and 85 in directions perpendicular to the face of the paper and opposite to each other.

In this embodiment, by connecting the conductive wires 84 and 85 in series, the carrier signal levels across both terminals of the conductive wires 84 and 85 are added, whereby magnetic detection sensitivity rises further.

The conductive wires 84 and 85 may be connected in parallel to use; however, in this case, a DC current twice as large as that in the case of the series connection is required. Hence, the series connection is more effective in power saving. The conductive wires 84 and 85 may be connected to independent different DC power sources, instead of being connected in series as described above. In this case, a first magnetic detection device comprising the conductive wire 84 and the magnetic cores 81 and 82 and a second magnetic detection device comprising the conductive wire 85 and the magnetic cores 81 and 83 can be used as two independent magnetic detection devices.

FIG. 20 is a cross-sectional view of another example of the magnetic detection device in accordance with this embodiment. In this example, the thickness of the first magnetic core 81 is made smaller than those of second and third magnetic cores 82 and 83. A device equivalent to the magnetic detection device in accordance with the above-mentioned first embodiment shown in part (a) of FIG. 4 is configured by the magnetic cores 81 and 82 and the conductive wire 84. Similarly, a device equivalent to the device shown in part (a) of the above-mentioned FIG. 4 is configured by the magnetic cores 81 and 83 and the conductive wire 85. Even in this example of the magnetic detection device, a magnetic detector may be configured by connecting the conductive wires 84 and 85 in series. Hence, the effect due to the series connection of the above-mentioned conductive wires 84 and 85 in accordance with this embodiment is obtained, in addition to the effect of the magnetic detection device shown in part (a) of the above-mentioned FIG. 4.

<Fifth Embodiment>

A magnetic detection device in accordance with a fifth embodiment of the present invention will be described referring to FIG. 21.

Part (a) of FIG. 21 is a plan view of a magnetic detection device 105 in accordance with the fifth embodiment of the present invention. Part (b) of FIG. 21 is a perspective view of a model for facilitating understanding of the structure of the magnetic detection device 105 shown in part (a) of FIG. 21. As shown in part (b) of FIG. 21, in a spiral conductive wire comprising conductive wires 122a to 122e and 123a to 123d, the portions of the conductive wires 122a to 122e are held between magnetic cores 111 and 112.

In part (a) of FIG. 21, the magnetic detection device 105 has the magnetic cores 111 and 112, each made of a thin film, on a substrate 41 made of a nonmagnetic material. The conductive wires 122a to 122e are provided between the magnetic core 111 and the magnetic core 112. The conductive wires 122a to 122e are connected in series by the conductive wires 123a to 123d, thereby forming a detection section 106. The end portion of the conductive wire 122a of the detection section 106 is connected to a terminal 115, and the end portion of the conductive wire 122e thereof is connected to a terminal 116. The conductive wires 122a to 122e, 123a to 123d and the terminals 115 and 116 are all formed of thin films, made of copper or the like. The magnetic cores 111 and 112 are formed of soft magnetic thin films.

The portion enclosed with a chain line 107 (hereafter referred to as a detection unit 107) in the detection section 106 comprises the magnetic cores 111 and 112 and the conductive wire 122a, and is substantially the same as the magnetic detection device in accordance with the first embodiment shown in FIG. 1. The magnetic cores 111 and 112 and the conductive wires 122a to 122e shown in part (a) of FIG. 21 correspond to the magnetic cores 11 and 12 and the conductive wire 14 shown in part (b) of FIG. 1, respectively. In the detection unit 107 shown at the top of part (a) of FIG. 21, one end of the conductive wire 122a having a straight shape and passing through the magnetic cores 111 and 112 is connected to the terminal 115, and via the conductive wire 123a having a nearly Z shape and passing along the upper face of the magnetic core 112, the other end is connected to the conductive wire 122b having a straight shape and disposed thereunder. Similarly, the conductive wires 122b and 122c are connected via the conductive wire 123b, and the conductive wires 122c and 122d are connected via the conductive wire 123c. The conductive wires 122d and 122e are connected via the conductive wire 123d, and the end portion of the conductive wire 122c is connected to the terminal 116. When the configuration shown in part (a) of FIG. 21 is represented by using a model, it is shown in the perspective view of part (b) of FIG. 21.

In accordance with this embodiment, a plurality (five in FIG. 21) of the detection units 107, each corresponding to the magnetic detection device shown in FIG. 1, are connected in series, and the five conductive wires 122a to 122e are connected in series.

When a magnetic detector is configured by using the magnetic detection device in accordance with this embodiment, the terminals 115 and 116 of the magnetic detection device 105 are connected to the terminals 134 and 137 of the detection circuit shown in FIG. 31, respectively. When a high-frequency current from the high-frequency oscillator 131 is flown from the conductive wire 122a to the conductive wire 122e, the change of the impedance from the conductive wire 122a to the conductive wire 122e, caused by an external magnetic field 100, that is, the change of the impedance between the terminals 115 and 116, becomes about five time as high as that of the device shown in part (b) of FIG. 1. Hence, magnetic detection sensitivity also becomes about five times. The number of the detection units 107 connected in series is not limited to five but any number can be used. When a DC current is flown from the conductive wire 122a to the conductive wire 122e, the directions of the currents passing therethrough are all the same for the conductive wire 122a to the conductive wire 122e. Hence, DC bias magnetic fields having the same direction are generated in the vicinities of these conductive wires 122a to 122e. In order to decrease the DC resistance from the terminal 115 to the terminal 116, it is desirable that the cross-sectional areas of the conductive wires 123a to 123d should be made larger than the cross-sectional areas of the conductive wires 122a to 122e.

<Sixth Embodiment>

A magnetic detection device in accordance with a sixth embodiment of the present invention will be described referring to FIG. 22, a plan view. In FIG. 22, four detection sections, each being the detection section 106 shown in part (a) of FIG. 21, are provided on a substrate 41, and the four detection sections 106 are all connected in series by using connection-use conductive wires 181. The conductive wire 122a of the detection section 106 disposed at the left end is connected to a terminal 115, and the conductive wire 122e of the detection section 106 disposed at the right end is connected to a terminal 116.

When a magnetic detector is configured by using the magnetic detection device in accordance with this embodiment, the terminals 115 and 116 of the magnetic detection device are connected to the terminals 134 and 137 of the detection circuit shown in FIG. 31, respectively. Since the amplification-type detection circuit shown in FIG. 31 operates even in the case when the DC resistances of the conductive wires are large, it can also be used for a detection device in accordance with this embodiment wherein the DC resistances of the conductive wires are relatively large.

Since the four detection sections 106 in accordance with the above-mentioned fifth embodiment are connected in series in this embodiment, the change of the impedance between the terminals 115 and 116 depending on an external magnetic field 100 becomes about four times as high as that of the device in accordance with the fifth embodiment. Hence, magnetic detection sensitivity also becomes about five times.

<Seventh Embodiment>

A magnetic detection device in accordance with a seventh embodiment of the present invention will be described referring to FIG. 23, a plan view. In FIG. 23, the portion enclosed with a chain line 107 is a detection unit 107 having the same configuration as that shown in FIG. 21. A detection section 106a comprises five detection units 107 connected vertically. Nine detection sections 106a are provided in parallel on a substrate 41. The conductive wires 122a of the nine detection units 107, on the top horizontal row in the figure, of the nine detection sections 106a are connected mutually. The conductive wires 122b of the nine detection units 107 on the second horizontal row from above are connected mutually. Similarly, the conductive wires 122c of the nine detection units 107 on the third horizontal row from above are connected, and the conductive wires 122d of the nine detection units 107 on the fourth horizontal row from above are connected. The conductive wires 122e of the nine detection units 107 on the bottom horizontal row are connected. The left end of the conductive wire 122a is connected to a terminal 115 on the substrate 41, and the right end of the conductive wire 122a is connected to the left end of the conductive wire 122b via a conductive wire 123 passing above the detection sections 106a. Similarly, the right end of the conductive wire 122b is connected to the left end of the conductive wire 122c via a conductive wire 123 passing above the detection sections 106a. The right end of the conductive wire 122c is connected to the left end of the conductive wire 122d via a conductive wire 123 passing above the detection sections 106a. The right end of the conductive wire 122d is connected to the left end of the conductive wire 122e via a conductive wire 123 passing above the detection sections 106a, and the right end of the conductive wire 122e is connected to a terminal 116. In this embodiment, the conductive wires 122a to 122e of the five vertical and nine horizontal detection units 107, 45 in total, are all connected in series. Hence, the change of the impedance between the terminals 115 and 116 depending on an external magnetic field 100 is about 45 times as high as that of one detection unit 107. Hence, magnetic detection sensitivity also is about 45 times. In the configuration of this embodiment, the clearance between the adjacent detection sections 106a can be made smaller than that shown in FIG. 22, whereby the arrangement density of the detection units 107 on the substrate 41 becomes higher. Hence, a highly-sensitive magnetic detection device can be produced by using the substrate 41 that is compact in size. The detection units 107 in accordance with the above-mentioned embodiments 5 to 7 are not limited to have the configuration and the device shown in part (b) of FIG. 1; the magnetic detection devices in accordance with the above-mentioned embodiments 1 to 4 may also be used for the detection units 107.

<Eighth Embodiment>

FIG. 24 is a plan view of a magnetic detection device in accordance with an eighth embodiment of the present invention. The detection unit 107a shown in FIG. 24 is substantially equivalent to the magnetic detection device shown in FIG. 10, the magnetic core 11 of which comprises the two magnetic cores 44 and 45. The other configuration is the same as that shown in FIG. 23. Since the detection sensitivity of the detection unit 107a is higher than the detection sensitivity of the detection unit 107 shown in FIG. 23, the magnetic detection device in accordance with this embodiment has detection sensitivity higher than that of the magnetic detection device shown in the above-mentioned FIG. 23.

<Ninth Embodiment>

A magnetic detection device in accordance with a ninth embodiment of the present invention will be described referring to FIG. 25, a plan view. In FIG. 25, a detection unit 107 is the same as the detection unit 107 shown in FIG. 23. In FIG. 25, the vertical lengths of the detection sections 106c disposed at both right and left ends are made shorter than the vertical lengths of the detection sections 106d disposed inward from them. In addition, the lengths of the detection sections 106d are made shorter than the lengths of the detection sections 106e disposed at the central portion. The working-effect obtained by this configuration will be described below in detail.

The inventors have found that when the magnetic detection device shown in FIG. 23 is placed in a magnetic field having a uniform intensity in the direction indicated by arrow 100, for example, the number of magnetic lines passing through the detection section 106f disposed at each end becomes larger than the number of magnetic lines passing through the detection section 106g disposed at the central portion. In other words, the magnetic flux densities of the magnetic lines passing through the nine detection sections 106a are not uniform. Hence, in the conductive wires 122a to 122e, the amount of the change of the impedance depending on a magnetic field at a portion in the detection section 106g disposed at the central portion is different from the amount at a portion in the detection section 106f disposed at the end portion. Owing to this influence, when a magnetic detection device is placed in a nonuniform magnetic field, the detected value changes depending on the position of the magnetic detection device, whereby correct measurement values may not be obtained.

When magnetic materials are placed in a uniform magnetic field, it is generally known that the magnetic flux density of a magnetic material being long along the direction of the magnetic field becomes higher than the magnetic flux density of a magnetic material being short along the direction. This phenomenon is caused by a diamagnetic action generated in a magnetic material along the direction of a magnetic field.

In this embodiment, as shown in FIG. 25, the lengths of the detection sections 106d are made shorter than those of the detection sections 106e disposed at the central portion, and the lengths of the detection sections 106c at both ends are made further shorter than those of the detection sections 106d; hence, the magnetic flux densities of the detection sections 106c, 106d and 106e are made equal in the uniform magnetic field 100. Therefore, a magnetic detection device, wherein the problem encountered in the magnetic detection device shown in the above-mentioned FIG. 23 has been solved, is obtained.

When a magnetic detector is configured by using the magnetic detection devices in accordance with the above-mentioned embodiments 7, 8 and 9, the detection circuit shown in FIG. 31 is used.

<Tenth Embodiment>

A magnetic detection device 160 in accordance with a tenth embodiment of the present invention will be described referring to FIGS. 26 to 28. FIG. 26 is a plan view of the magnetic detection device 160. FIG. 27 is a cross-sectional view of a detection unit 150 enclosed with a chain line and taken on line XXVII—XXVII of FIG. 26. In the magnetic detection device in accordance with this embodiment shown in FIG. 26, five of the above-mentioned detection units 150 having the same configuration are connected vertically, and this is referred to as a detection section 165. In addition, nine of the detection sections 165 are arranged in parallel horizontally, whereby the magnetic detection device 160 in accordance with this embodiment comprises 45 detection units 150. The number of the detection units is not limited to 45; this number is an example. In the cross-sectional view of the detection unit 150 shown in FIG. 27, a first magnetic core 151 made of a soft magnetic film is formed on a substrate 41 by a film formation technology. At a portion of the magnetic core 151, a first conductive wire 153a is formed via an insulation film 152 made of a SiO$_2$ film. On the first conductive wire 153a, a second conductive wire 155a is formed via an insulation film 154 made of a SiO$_2$ film. Furthermore, on the second conductive wire 155a, an insulation film 156 made of a SiO$_2$ film is formed. On the insulation film 156 and the magnetic core 151, a second magnetic core 158 made of a soft magnetic film is formed. The magnetic core 158 is formed as a film so that the thicknesses of both the inclined portions 158a thereof are smaller than that of the other portion and so that the cross-sectional areas of the inclined portions 158a are smaller than that of the other portion. An insulation film 159 made of a SiO$_2$ film is formed on the magnetic core 158, and a connection wire 140a made of a conductor is formed on the insulation film 159 at the right end portion thereof.

Regarding the magnetic detection device 160 shown in FIG. 26, the connection of the first conductive wires 153a to 153e will be described first. In the nine detection sections 165 shown in FIG. 26, the respective conductive wires 153a of the nine detection units 150 on the top horizontal row are connected in series. Similarly, the respective conductive wires 153b of the nine detection units 150 on the second horizontal row from above are connected in series, and the respective conductive wires 153c of the nine detection units 150 on the third horizontal row from above are connected in series. Furthermore, the respective conductive wires 153d of the nine detection units 150 on the fourth horizontal row from above are connected in series, and the respective conductive wires 153e of the nine detection units 150 on the bottom horizontal row are connected in series. The left end of the conductive wire 153a is connected to a terminal 115 via the connection wire 140a passing horizontally above the nine detection sections 165. The right end of the conductive wire 153a is connected to the left end of the conductive wire 153b via a connection wire 140b passing horizontally above the nine detection sections 165. Similarly, the right end of the conductive wire 153b is connected to the left end of the conductive wire 153c via a connection wire 140c, and the right end of the conductive wire 153c is connected to the left end of the conductive wire 153d via a connection wire 140d. The right end of the conductive wire 153d is connected to the left end of the conductive wire 153e via a connection wire 140e, and the right end of the conductive wire 153e is connected to a terminal 116 via a connection wire 140f. As a result, the conductive wires 153a to 153e are connected in series between the terminals 115 and 116.

The connection of the second conductive wires 155a to 155e will be described. In the nine detection sections 165 shown in the figure, the respective conductive wires 155a of the nine detection units 150 on the top horizontal row are also connected in series. Similarly, the respective conductive wires 155b of the nine detection units 150 on the second horizontal row from above are connected in series. The respective conductive wires 155c of the nine detection units 150 on the third horizontal row from above are connected in series. The respective conductive wires 155d of the nine detection units 150 on the fourth horizontal row from above are connected in series. The respective conductive wires 155e of the nine detection units 150 on the bottom horizontal row are connected in series. The left end of the conductive wire 155a is connected to a terminal 135. The right end of the conductive wire 155a is connected to the right end of the conductive wire 155b, and the left end of the connection wire 155b is connected to the left end of the connection wire 155c. The right end of the conductive wire 155c is connected to the right end of the conductive wire 155d, and the left end of the connection wire 155d is connected to the left end of the connection wire 155e. The right end of the conductive wire 155e is connected to a terminal 136. As a result, the conductive wires 155a to 155e are connected in series between the terminals 135 and 136. The conductive wires 155a to 155e connected in series are represented as a conductive wire 155.

When a magnetic detector is configured by using the magnetic detection device in accordance with this embodiment, the oscillation-type detection circuit shown in FIG. 28 is used. In FIG. 28, the terminals 115 and 116 of the magnetic detection device 160 are connected to a DC power source 185 for magnetic bias, to which a resistor 180 is connected in series. In addition, the terminals 135 and 136 are connected between the input and output of the inventor circuit 551 of an oscillation circuit 500. One ends of capacitors 552 and 554 are connected to the electrode terminals 135 and 136, respectively, and the other ends of the capacitors 552 and 554 are connected to circuit ground G. A positive DC voltage (+V) is applied to the power source terminal 553 of the inventor circuit 551. This oscillation circuit 500 is combined with the conductive wire 155 having an inductance, thereby forming a Colpitts oscillation circuit, one type of LC oscillators. The oscillation frequency of the oscillation circuit 500 is 10 MHz, for example.

The DC current flowing from the DC power source 185 to the conductive wire 140 via the resistor 180 generates a magnetic flux indicated by arrow 170 in HG. 27 (hereafter referred to as a bias magnetic flux 170) in the magnetic cores 151 and 158 of each detection unit 150. This bias magnetic flux 170 forms a bias magnetic field. When the magnetic detector being in this state is placed in an external magnetic field 100 shown in FIG. 28, the inductance of the conductive wire 155 changes depending on the change of the external magnetic field 100 owing to an action similar to that in the case of each of the above-mentioned embodiments. Depending on the change of the impedance of the conductive wire 155, the oscillation frequency of the oscillation circuit 500 in the detection circuit shown in HG. 28 changes, and a frequency modulated (FM) signal is output. By demodulating the frequency modulated signal of the oscillation circuit 500 using an FM demodulation circuit 561, the change amount of the oscillation frequency can be output as the change amount of the output level. Since the change of the oscillation frequency corresponds to the changes of the intensity and direction of the external magnetic field, the intensity and direction of the external magnetic field can be detected by detecting the output of the FM demodulation circuit 561 using a magnetic field detection circuit 562.

Since the magnetic detection device 160 in accordance with this embodiment has 45 detection units 150, its external magnetic field detection sensitivity is about 45 times as high as that of one detection unit 150, whereby a highly-sensitive magnetic detector can be attained.

Since the conductive wire 140 through which the DC current for a bias magnetic field flows is electrically insulated from the conductive wire 155 through which the high-frequency current flows, the voltage of the DC power source 185 for magnetic bias and the voltage at the power source terminal 553 of the oscillation circuit 500 can be set respectively at any values.

In addition, since the change of the external magnetic field 100 is detected by the change of the frequency, the detection is hardly affected by electrical noise coming externally, mainly including AM modulated waves.

In the above-mentioned respective embodiments, FeTaN are used for soft magnetic films; however, magnetic materials, such as Fe-based and Co-based metal magnetic films and oxide magnetic films, superior in effective permeability, can be used. Copper is used for conductive metal films; however, metal films made of Au, Ag, etc. having high specific resistances may also be used. In addition, $SiO_2$ is used for insulation films; however, dielectric films made of inorganic materials, such as alumina and glass, may also be used. Furthermore, a ceramic substrate including NiTiMg is used as the substrate; however, substrates made of other ceramic materials such as AlTiC, glass-based materials and carbon may also be used. $SiO_2$ is used as the material of the nonmagnetic portions; however, other nonmagnetic materials may also be used. $SiO_2$ is used for the protective film; however, other dielectrics, such as alumna, and resins and the like may also be used.

Regarding the production methods, ion milling is mainly used as an etching method; however, other etching methods, such as wet etching, may also be used. Sputtering is mainly used as a film formation method; however, other methods, such as deposition and plating, may also be used.

INDUSTRIAL APPLICABILITY

In the magnetic detection device in accordance with the present invention, two magnetic cores made of soft magnetic films and a conductive wire made of a conductive film provided between the two magnetic cores, constituting the magnetic detection device, are formed by a thin-film formation technology. The area of the cross-section (cross-sectional area), perpendicular to a magnetic path, of the magnetic core is made smaller at a portion thereof by adjusting film formation conditions at the time of film formation or by using a film processing technology, such as etching. By utilizing the action wherein the permeability at the portion having the smaller cross-sectional area decreases owing to the increase of magnetic flux density, a magnetic detector having high magnetic detection sensitivity is obtained. Since the magnetic cores and the conductor are formed of thin films, a magnetic detection device being compact in size and light in weight can be produced at low cost.

The invention claimed is:

1. A magnetic detection device comprising:
a first magnetic core of a soft magnetic film,
a conductive wire formed on said first magnetic core at a portion thereof, and
a second magnetic core of a soft magnetic film formed on said first magnetic core so as to hold said conductive wire therebetween, the area of the cross-section perpendicular to a magnetic path being partially different,
wherein a current in which a DC bias current is superimposed on an AC current is let to flow through said conductive wire, and
wherein grooves are formed so that the area of the cross-section perpendicular to a magnetic path of said second magnetic core at the circumference of said conductive wire is made smaller than that at the other portion.

2. A magnetic detection device comprising:
a first magnetic core of a soft magnetic film,
a conductive wire formed on said first magnetic core at a portion thereof, and
a second magnetic core of a soft magnetic film formed on said first magnetic core so as to hold said conductive wire therebetween, the area of the cross-section perpendicular to a magnetic path being partially different,
wherein a current in which a DC bias current is superimposed on an AC current is let to flow through said conductive wire, and
wherein the thickness of said conductive wire is larger than the thickness of one of said first magnetic core and said second magnetic core,
wherein the ratio (thickness/length) of the thickness of said conductive wire to the length thereof in a direction parallel with the direction of a magnetic field to be detected is ¼ or more.

3. A magnetic detection device comprising:
a first magnetic core of a soft magnetic film having a nearly rectangular shape and formed on a nonmagnetic substrate,
a plurality of first conductive wires formed on said first magnetic core at predetermined intervals in a direction perpendicular to the longitudinal direction of said rectangular first magnetic core,
a second magnetic core of a soft magnetic film formed on said first magnetic core so as to hold said first conductive wires therebetween, the area of the cross-section perpendicular to a magnetic path being partially different, and
a plurality of second conductive wires for connecting said plurality of first conductive wires in series, wherein a current in which a DC bias current is superimposed on an AC current is let to flow through said conductive wires.

4. A magnetic detection device in accordance with claim 3, comprising a plurality of magnetic detection devices, each comprising:
a first magnetic core of a soft magnetic film having a nearly rectangular shape and formed on a nonmagnetic substrate,
a plurality of first conductive wires formed on said first magnetic core at predetermined intervals in a direction perpendicular to the longitudinal direction of said rectangular first magnetic core,
a second magnetic core formed on said first magnetic core so as to hold said first conductive wires therebetween, the area of the cross-section perpendicular to a magnetic path of said second magnetic core being partially different, and
a plurality of second conductive wires for connecting said plurality of first conductive wires in series,
wherein said plurality of magnetic detection devices are arranged in parallel with said longitudinal direction, and said first and second conductive wires of the respective detection devices are all connected in series.

5. A magnetic detection device comprising:
a plurality of first magnetic cores having a nearly rectangular shape and formed in parallel on a nonmagnetic substrate,
a plurality of first conductive wires formed on said plurality of first magnetic cores at predetermined intervals in a direction perpendicular to the longitudinal direction of said plurality of first magnetic cores,
second magnetic cores formed on said plurality of first magnetic cores so as to hold said first conductive wires therebetween, the areas of the cross-sections perpendicular to magnetic paths being partially different, and
second conductive wires for connecting all of said plurality of first conductive wire s in series,
wherein a current in which a DC bias current is superimposed on an AC current is let to flow through said conductive wires.

6. A magnetic detection device in accordance with claim 5, wherein the thicknesses of said second magnetic cores in the vicinities of said first conductive wires are made smaller.

7. A magnetic detection device in accordance with claim 5, wherein among said plurality of first and second magnetic cores having a nearly rectangular shape and formed in parallel on said nonmagnetic substrate, those disposed at both end portions are made shorter than those disposed at the central portion.

8. A magnetic detection device in accordance with claim 3, wherein said second conductive wires are conductive films formed on said second magnetic core.

9. A magnetic detection device in accordance with claim 3, wherein insulation films are provided between said first magnetic core and said first conductive wire, between said first conductive wire and said second magnetic core and between said second magnetic core and said second conductive wire.

* * * * *